United States Patent
Nagyvary et al.

(10) Patent No.: US 9,806,215 B2
(45) Date of Patent: Oct. 31, 2017

(54) ENCAPSULATED CONCENTRATED PHOTOVOLTAIC SYSTEM SUBASSEMBLY FOR III-V SEMICONDUCTOR SOLAR CELLS

(75) Inventors: John Nagyvary, Albuquerque, NM (US); Peter Allen Zawadzki, Clinton, NJ (US); Steve Seel, Cary, NC (US); James Foresi, Albuquerque, NM (US)

(73) Assignee: SUNCORE PHOTOVOLTAICS, INC., Irwindale, CA (US)

( * ) Notice: Subject to any disclaimer, the term of this patent is extended or adjusted under 35 U.S.C. 154(b) by 1195 days.

(21) Appl. No.: 12/553,813

(22) Filed: Sep. 3, 2009

(65) Prior Publication Data

US 2011/0048535 A1   Mar. 3, 2011

(51) Int. Cl.
| | |
|---|---|
| H01L 31/0203 | (2014.01) |
| H01L 31/0232 | (2014.01) |
| H01L 31/052 | (2014.01) |
| H01L 31/02 | (2006.01) |
| H01L 31/054 | (2014.01) |

(52) U.S. Cl.
CPC ...... *H01L 31/052* (2013.01); *H01L 31/02008* (2013.01); *H01L 31/0547* (2014.12); *Y02E 10/52* (2013.01)

(58) Field of Classification Search
USPC ...................................................... 136/246
See application file for complete search history.

(56) References Cited

U.S. PATENT DOCUMENTS

| | | |
|---|---|---|
| 3,589,946 A | 6/1971 | Krishnan et al. |
| 3,798,040 A | 3/1974 | Kamin et al. |
| 3,811,954 A | 5/1974 | Lindmayer |
| 3,966,499 A | 6/1976 | Yasui et al. |

(Continued)

FOREIGN PATENT DOCUMENTS

| | | |
|---|---|---|
| DE | 26 07 005 C2 | 9/1976 |
| DE | 26 07 509 A1 | 9/1977 |

(Continued)

OTHER PUBLICATIONS

U.S. Appl. No. 12/764,657, filed Apr. 21, 2010, Nagyvary et al.

(Continued)

*Primary Examiner* — Magali P Slawski
(74) *Attorney, Agent, or Firm* — Mueting, Raasch & Gebhardt, P.A.

(57) ABSTRACT

A solar cell receiver subassembly for use in a concentrating solar system which concentrates the solar energy onto a solar cell by a factor of 1000 or more for converting solar energy to electricity, including an optical element defining an optical channel, a solar cell receiver having a support; a solar cell mounted on the support adjacent to the optical element and in the optical path of the optical channel, the solar cell comprising one or more III-V compound semiconductor layers and capable of generating in excess of 20 watts of peak DC power; a diode mounted on the support and coupled in parallel with the solar cell; and first and second electrical contacts mounted on the support and coupled in parallel with the solar cell and the diode; and an encapsulant covering the support, the solar cell, the diode, and at least a portion of the exterior sides of the optical element.

16 Claims, 4 Drawing Sheets

(56) References Cited

U.S. PATENT DOCUMENTS

| | | | |
|---|---|---|---|
| 3,999,283 A | 12/1976 | Dean et al. |
| 4,001,864 A | 1/1977 | Gibbons |
| 4,017,332 A | 4/1977 | James |
| 4,109,640 A | 8/1978 | Smith |
| 4,164,432 A | 8/1979 | Boling |
| 4,168,696 A | 9/1979 | Kelly |
| 4,186,033 A | 1/1980 | Boling |
| 4,188,238 A | 2/1980 | Boling |
| 4,191,593 A | 3/1980 | Cacheux |
| 4,192,583 A | 3/1980 | Horton |
| 4,231,808 A | 11/1980 | Tabei et al. |
| 4,268,709 A | 5/1981 | Boling |
| 4,292,959 A | 10/1981 | Coburn, Jr. |
| 4,329,535 A | 5/1982 | Rapp |
| 4,338,480 A | 7/1982 | Antypas et al. |
| 4,438,168 A | 3/1984 | Testard |
| 4,460,232 A | 7/1984 | Sotolongo |
| 4,521,801 A | 6/1985 | Kato et al. |
| 4,574,659 A | 3/1986 | Arndt |
| 4,585,318 A | 4/1986 | Seifert |
| 4,711,972 A | 12/1987 | O'Neill |
| 4,759,803 A | 7/1988 | Cohen |
| 4,830,678 A * | 5/1989 | Todorof et al. ............ 136/259 |
| 4,834,805 A | 5/1989 | Erbert |
| 4,939,205 A * | 7/1990 | Derudder et al. ............ 525/63 |
| 5,009,720 A | 4/1991 | Hokuyo et al. |
| 5,019,177 A | 5/1991 | Wanlass |
| 5,053,083 A | 10/1991 | Sinton |
| 5,091,018 A | 2/1992 | Fraas et al. |
| 5,096,505 A | 3/1992 | Fraas et al. |
| 5,118,361 A | 6/1992 | Fraas et al. |
| 5,153,780 A | 10/1992 | Jorgensen et al. |
| 5,167,724 A | 12/1992 | Chiang |
| 5,217,539 A | 6/1993 | Fraas et al. |
| 5,255,666 A | 10/1993 | Curchod |
| 5,322,572 A | 6/1994 | Wanlass |
| 5,342,453 A | 8/1994 | Olson |
| 5,374,317 A | 12/1994 | Lamb et al. |
| 5,376,185 A | 12/1994 | Wanlass |
| 5,405,453 A | 4/1995 | Ho et al. |
| 5,409,550 A | 4/1995 | Safir |
| 5,460,659 A | 10/1995 | Krut |
| 5,498,297 A | 3/1996 | O'Neill et al. |
| 5,616,185 A | 4/1997 | Kukulka |
| 5,622,078 A | 4/1997 | Mattson |
| 5,660,644 A | 8/1997 | Clemens |
| 5,742,009 A | 4/1998 | Hamzehdoost et al. |
| 5,936,777 A | 8/1999 | Dempewolf |
| 5,944,913 A | 8/1999 | Hou et al. |
| 5,951,785 A | 9/1999 | Uchihashi et al. |
| 5,959,787 A | 9/1999 | Fairbanks |
| 5,977,478 A | 11/1999 | Hibino et al. |
| 5,990,414 A * | 11/1999 | Posnansky ............ 136/244 |
| 6,020,555 A | 2/2000 | Garboushian et al. |
| 6,031,179 A | 2/2000 | O'Neill |
| 6,043,425 A | 3/2000 | Assad |
| 6,057,505 A | 5/2000 | Ortabasi |
| 6,077,722 A * | 6/2000 | Jansen et al. ............ 438/74 |
| 6,080,927 A | 6/2000 | Johnson |
| 6,091,020 A | 7/2000 | Fairbanks et al. |
| 6,103,970 A | 8/2000 | Kilmer et al. |
| 6,239,354 B1 | 5/2001 | Wanlass |
| 6,252,155 B1 | 6/2001 | Ortabasi |
| 6,252,287 B1 | 6/2001 | Kurtz et al. |
| 6,278,054 B1 | 8/2001 | Ho et al. |
| 6,281,426 B1 | 8/2001 | Olson et al. |
| 6,300,557 B1 | 10/2001 | Wanlass |
| 6,300,558 B1 | 10/2001 | Takamoto et al. |
| 6,316,716 B1 | 11/2001 | Hilgrath |
| 6,326,540 B1 | 12/2001 | Kilmer et al. |
| 6,331,670 B2 | 12/2001 | Takehara et al. |
| 6,340,788 B1 | 1/2002 | King et al. |
| 6,344,612 B1 | 2/2002 | Kuwahara et al. |
| 6,359,210 B2 | 3/2002 | Ho et al. |
| 6,372,980 B1 | 4/2002 | Freundlich |
| 6,384,317 B1 | 5/2002 | Kerschaver et al. |
| 6,399,874 B1 | 6/2002 | Olah |
| 6,452,086 B1 | 9/2002 | Muller |
| 6,469,241 B1 | 10/2002 | Penn |
| 6,482,672 B1 | 11/2002 | Hoffman et al. |
| 6,483,093 B1 | 11/2002 | Takemura et al. |
| 6,600,100 B2 | 7/2003 | Ho et al. |
| 6,603,069 B1 | 8/2003 | Muhs et al. |
| 6,610,919 B2 | 8/2003 | Ohkubo |
| 6,617,508 B2 | 9/2003 | Kilmer et al. |
| 6,660,928 B1 | 12/2003 | Patton et al. |
| 6,680,432 B2 | 1/2004 | Sharps et al. |
| 6,700,054 B2 | 3/2004 | Cherney et al. |
| 6,700,055 B2 | 3/2004 | Barone |
| 6,730,840 B2 | 5/2004 | Sasaoka et al. |
| 6,799,742 B2 | 10/2004 | Nakamura et al. |
| 6,804,062 B2 | 10/2004 | Atwater et al. |
| 6,903,261 B2 | 6/2005 | Habraken et al. |
| 6,951,819 B2 | 10/2005 | Iles et al. |
| 6,959,993 B2 | 11/2005 | Gross et al. |
| 7,071,407 B2 | 7/2006 | Fatemi et al. |
| 7,119,271 B2 | 10/2006 | King et al. |
| 7,192,146 B2 | 3/2007 | Gross et al. |
| 7,238,879 B2 | 7/2007 | Matsushita et al. |
| 7,244,998 B2 | 7/2007 | Nakata |
| 7,381,886 B1 | 6/2008 | Aiken |
| 7,671,270 B2 | 3/2010 | Fang |
| 7,807,920 B2 * | 10/2010 | Linke et al. ............ 136/246 |
| 7,980,314 B2 | 7/2011 | Mack |
| 8,093,492 B2 | 1/2012 | Hering et al. |
| 8,148,628 B2 | 4/2012 | Fang |
| 2001/0006066 A1 | 7/2001 | Cherney et al. |
| 2002/0040727 A1 | 4/2002 | Stan et al. |
| 2002/0066828 A1 | 6/2002 | Nakamura et al. |
| 2002/0075579 A1 | 6/2002 | Vasylyev et al. |
| 2002/0117675 A1 | 8/2002 | Mascarenhas |
| 2002/0139415 A1 | 10/2002 | Shimizu et al. |
| 2002/0148497 A1 | 10/2002 | Sasaoka et al. |
| 2002/0164834 A1 | 11/2002 | Boutros et al. |
| 2003/0015233 A1 | 1/2003 | Barone |
| 2003/0070707 A1 | 4/2003 | Kings et al. |
| 2003/0121542 A1 | 7/2003 | Harneit et al. |
| 2003/0136442 A1 | 7/2003 | Takamoto |
| 2003/0140962 A1 | 7/2003 | Sharps et al. |
| 2003/0145884 A1 | 8/2003 | King et al. |
| 2003/0178057 A1 | 9/2003 | Fujit |
| 2004/0031517 A1 | 2/2004 | Bareis |
| 2004/0045598 A1 | 3/2004 | Narayanan et al. |
| 2004/0084077 A1 | 5/2004 | Aylaian et al. |
| 2004/0112424 A1 | 6/2004 | Araki et al. |
| 2004/0134531 A1 | 7/2004 | Habraken et al. |
| 2004/0149331 A1 | 8/2004 | Sharps et al. |
| 2004/0173257 A1 | 9/2004 | Rogers |
| 2004/0194820 A1 | 10/2004 | Barone |
| 2004/0261838 A1 | 12/2004 | Cotal et al. |
| 2004/0261839 A1 | 12/2004 | Gee et al. |
| 2005/0034751 A1 | 2/2005 | Gross et al. |
| 2005/0034752 A1 | 2/2005 | Gross et al. |
| 2005/0046977 A1 | 3/2005 | Shifman |
| 2005/0048310 A1 | 3/2005 | Cocchi et al. |
| 2005/0051205 A1 | 3/2005 | Mook, Jr. |
| 2005/0081908 A1 | 4/2005 | Stewart |
| 2005/0081909 A1 | 4/2005 | Paull |
| 2005/0092360 A1 | 5/2005 | Clark |
| 2005/0109386 A1 | 5/2005 | Marshall |
| 2005/0145274 A1 | 7/2005 | Polce et al. |
| 2005/0206834 A1 | 9/2005 | D'Agostino |
| 2005/0268958 A1 | 12/2005 | Aoyama |
| 2005/0274411 A1 | 12/2005 | King et al. |
| 2006/0042650 A1 | 3/2006 | Ochs |
| 2006/0054211 A1 | 3/2006 | Meyers |
| 2006/0119305 A1 | 6/2006 | Lee et al. |
| 2006/0130892 A1 | 6/2006 | Algora |
| 2006/0144435 A1 | 7/2006 | Wanlass |
| 2006/0162768 A1 | 7/2006 | Wanlass |
| 2006/0169315 A1 | 8/2006 | Levin |
| 2006/0185713 A1 | 8/2006 | Mook, Jr. |
| 2006/0185726 A1 | 8/2006 | Rogers et al. |
| 2006/0231130 A1 | 10/2006 | Sharps et al. |

(56) References Cited

U.S. PATENT DOCUMENTS

| | | |
|---|---|---|
| 2006/0249198 A1 | 11/2006 | Rhee |
| 2006/0283497 A1 | 12/2006 | Hines |
| 2007/0034250 A1 | 2/2007 | Dutta |
| 2007/0044833 A1 | 3/2007 | Chern et al. |
| 2007/0089777 A1 | 4/2007 | Johnson et al. |
| 2007/0095385 A1 | 5/2007 | Shin et al. |
| 2007/0116414 A1* | 5/2007 | Penumatcha et al. ......... 385/89 |
| 2007/0188876 A1 | 8/2007 | Hines et al. |
| 2007/0193620 A1 | 8/2007 | Hines et al. |
| 2007/0199563 A1 | 8/2007 | Fox |
| 2007/0227581 A1 | 10/2007 | Chen et al. |
| 2007/0246040 A1 | 10/2007 | Schaafsma |
| 2007/0277873 A1 | 12/2007 | Cornfeld et al. |
| 2008/0029151 A1 | 2/2008 | McGlynn et al. |
| 2008/0123313 A1 | 5/2008 | Horne et al. |
| 2008/0128586 A1 | 6/2008 | Johnson et al. |
| 2008/0258051 A1 | 10/2008 | Heredia et al. |
| 2008/0308154 A1 | 12/2008 | Cart et al. |
| 2009/0000662 A1 | 1/2009 | Harwood et al. |
| 2009/0025778 A1 | 1/2009 | Rubin et al. |
| 2009/0026279 A1 | 1/2009 | Dittmer et al. |
| 2009/0032086 A1 | 2/2009 | Kats et al. |
| 2009/0032092 A1 | 2/2009 | Fang |
| 2009/0032093 A1 | 2/2009 | Fang |
| 2009/0056790 A1 | 3/2009 | Tian et al. |
| 2009/0101207 A1 | 4/2009 | Milbourne et al. |
| 2009/0107540 A1 | 4/2009 | Milbourne |
| 2009/0107541 A1 | 4/2009 | Linke et al. |
| 2009/0114213 A1 | 5/2009 | McDonald et al. |
| 2009/0114265 A1 | 5/2009 | Milbourne et al. |
| 2009/0114280 A1 | 5/2009 | Jensen et al. |
| 2009/0117332 A1 | 5/2009 | Ellsworth et al. |
| 2009/0120499 A1 | 5/2009 | Prather et al. |
| 2009/0120500 A1 | 5/2009 | Prather et al. |
| 2009/0140406 A1 | 6/2009 | Horne et al. |
| 2009/0159122 A1* | 6/2009 | Shook et al. ............. 136/256 |
| 2009/0159126 A1 | 6/2009 | Chan |
| 2009/0159128 A1* | 6/2009 | Shook et al. ............. 136/259 |
| 2009/0173376 A1 | 7/2009 | Spencer et al. |
| 2009/0199890 A1 | 8/2009 | Hering et al. |
| 2009/0199891 A1 | 8/2009 | Hering et al. |
| 2010/0018570 A1 | 1/2010 | Cashion et al. |
| 2010/0032004 A1 | 2/2010 | Baker et al. |
| 2010/0037935 A1 | 2/2010 | Vaid et al. |
| 2010/0083998 A1 | 4/2010 | Seel et al. |
| 2010/0139752 A1 | 6/2010 | Fang |
| 2010/0218806 A1* | 9/2010 | Arab et al. .................. 136/246 |
| 2010/0229947 A1 | 9/2010 | Seel |
| 2010/0302654 A1 | 12/2010 | Amano et al. |
| 2010/0307563 A1* | 12/2010 | Vilella ........................ 136/246 |
| 2010/0313954 A1 | 12/2010 | Seel et al. |
| 2011/0155217 A1 | 6/2011 | Yang et al. |

FOREIGN PATENT DOCUMENTS

| | | |
|---|---|---|
| DE | 29 24 510 A1 | 1/1981 |
| DE | 196 09 283 A1 | 9/1997 |
| DE | 102004050638 | 2/2006 |
| DE | 10 2005 000 767 A1 | 7/2006 |
| DE | 10 2005 047 132 A1 | 4/2007 |
| DE | 10 2008 012 335 A1 | 3/2009 |
| EP | 1469528 | 10/2004 |
| EP | ITMI2007183 3 | 12/2007 |
| EP | 0 657 948 B1 | 2/2008 |
| GB | 2346010 | 7/2000 |
| JP | 60-160181 | 8/1985 |
| JP | 03-209881 | 9/1991 |
| JP | 05-067770 | 3/1993 |
| JP | 05-102518 | 4/1993 |
| JP | 05-110128 | 4/1993 |
| JP | 9-64397 | 3/1997 |
| JP | 10-232910 | 9/1998 |
| JP | 2000-196127 | 7/2000 |
| JP | 2000-223730 | 8/2000 |
| JP | 2001-36120 | 2/2001 |
| JP | 2001-168368 | 6/2001 |
| JP | 2004-342986 | 12/2004 |
| JP | 2005-269627 | 9/2005 |
| JP | 2006-093335 | 4/2006 |
| JP | 2006-344698 | 12/2006 |
| KR | 2003002105 | 1/2003 |
| WO | WO 89/05463 A1 | 6/1989 |
| WO | WO 91/18419 | 11/1991 |
| WO | WO 91/18420 | 11/1991 |
| WO | WO 96/18213 | 6/1996 |
| WO | WO 99/62125 | 12/1999 |
| WO | WO 02/080286 A1 | 10/2002 |
| WO | WO 2005/048310 | 5/2005 |
| WO | WO 2006/042650 | 2/2006 |
| WO | WO 2006/119305 | 9/2006 |
| WO | WO 2006/114457 A1 | 11/2006 |
| WO | WO 2006114457 A1 * | 11/2006 |
| WO | 2008/045187 A2 | 4/2008 |

OTHER PUBLICATIONS

Abdel Mesih et al., "Loss of optical quality of a photovoltaic thermal concentrator device at different tracking position," 4th International Conference on Solar Concentrators for the Generation of Electricity or Hydrogen, Mar. 12-16, 2007, San Lorenzo de El Escorial, Spain; 4 pgs.

Aiken et al., "A Loss Analysis for a 28% Efficient 520X Concentrator Module," Conference Record of the 2006 IEEE 4th World Conference on Photovoltaic Energy Conversion, Waikoloa, Hawaii, May 7-12, 2006; pp. 686-689.

Aiken et al., "Consideration of High Bandgap Subcells for Advanced Multijunction Solar Cells," Conference Record of the 2006 IEEE 4th World Conference on Photovoltaic Energy Conversion, Waikoloa, Hawaii, May 7-12, 2006; pp. 838-841.

Aiken et al., "Temperature Dependent Spectral Response Measurements for III-V Multi-junction Solar Cells," 29th IEEE Photovoltaic Specialists Conference, New Orleans, LA, May 19, 2002; pp. 828-831.

Aiken et al., "Development and testing of III-V multijunction-based terrestrial concentrator modules," Conference Record of the Thirty-First IEEE Photovoltaic Specialist Conference, Lake Buena Vista, FL, Jan. 3-7, 2005; pp. 743-746.

Aiken et al., "Design, Manufacturing, and Testing of a Prototype Multijunction Concentrator Module," International Conference on Solar Concentrators for the Generation of Electricity or Hydrogen, Scottsdale, Arizona, May 1-5, 2005; Abstract only, 1 pg.

Aiken et al., "Delivering Known Good Die: High Volume testing of Multijunction Solar Cells for Use in Terrestrial Concentrator Systems," 4th International Conference on Solar Concentrators for the Generation of Electricity or Hydrogen, Mar. 12-16, 2007, San Lorenzo de El Escorial, Spain.

Algora et al., "III-V concentrator solar cells as LEDs," III-Vs Review, The Advanced Semiconductor Magazine, Aug. 2005; 18(6):40-42.

Algora et al., "Strategic options for a LED-like approach in III-V concentrator photovoltaics," Conference Record of the 2006 IEEE 4th World Conference on Photovoltaic Energy Conversion, Waikoloa, Hawaii, May 7-12, 2006; pp. 741-744.

Andreev et al., "Tunnel diode revealing peculiarities at I-V measurements in multijunction III-V solar cells," Conference Record of the 2006 IEEE 4th World Conference on Photovoltaic Energy Conversion, Waikoloa, Hawaii, May 7-12, 2006; pp. 799-802.

Anstey et al., "Progress with the Whitfield Solar PV Concentrator," 4th International Conference on Solar Concentrators for the Generation of Electricity or Hydrogen, Mar. 12-16, 2007, San Lorenzo de El Escorial, Spain; 3 pgs.

Araki et al., "Development of a new 550X concentrator module with 3J cells—performance and reliability," Conference Record of the Thirty-First IEEE Photovoltaic Specialist Conference, Lake Buena Vista, FL; Jan. 3-7, 2005; pp. 631-634.

Araki et al., "Development of concentrator modules with dome-shaped Fresnel lenses and triple junction concentrator cells," Prog. Photovolt.: Res. Appl., Sep. 2005; 13(6):513-527.

(56) References Cited

OTHER PUBLICATIONS

Araki et al., "Packaging III-V tandem solar cells for practical terrestrial applications achievable to 27% of module efficiency by conventional machine assemble technology," Sol. Energy Mater. Sol. Cells; Nov. 23, 2006; 90(18-19): 3320-3326.

Araki et al., "A small sun in an ETUI—possibilities in HCPV," Conference Record of the 2006 IEEE 4th World Conference on Photovoltaic Energy Conversion, Waikoloa, Hawaii, May 7-12, 2006; pp. 603-608.

Araki et al., "Achievement of 27% efficient and 200 Wp concentrator module and the technological roadmap toward realization of more than 31% efficient modules," Sol Energ Mater Sol Cells; Nov. 23, 2006; 90(18-19):3312-3319.

Araki, "500X to 1000X—R&D and Market Strategy of Daido Steel," 4th International Conference on Solar Concentrators for the Generation of Electricity or Hydrogen, Mar. 12-16, 2007, San Lorenzo de El Escorial, Spain, 4 pgs.

Balenzategui et al., "Design of hemispherical cavities for LED-based illumination devices," Applied Physics B (Lasers and Optics), Jan. 2006; 82(1):75-80.

Baudrit et al., "3D modeling of concentrator III-V multi junction solar cells," Conference Record of the 2006 IEEE 4th World Conference on Photovoltaic Energy Conversion, Waikoloa, May 7-12, 2006; pp. 826-829.

Baudrit et al., "III-V concentrator solar cells simulation: a 2D/3D approach for the design and optimization," 2005 Spanish Conference on Electron Devices; Tarragona Spain, Feb. 2-4, 2005; 4 pgs.

Baudrit et al., "Numerical analysis of GaInP solar cells: toward advanced photovoltaic devices modeling," Proceedings of the 5th International Conference on Numerical Simulation of Optoelectronic Devices, Berlin, Germany; Sep. 19-25, 2005; pp. 41-42.

Baur et al., "Triple junction III-V based concentrator solar cells: Perspectives and challenges," J Sol Energy Eng, Aug. 2007; 129(3):258-265.

Benitez et al., "XR: A High-Performance Photovoltaic Concentrator," 4th International Conference on Solar Concentrators for the Generation of Electricity or Hydrogen, Mar. 12-16, 2007, San Lorenzo de El Escorial, Spain, 4 pgs.

Bett et al., "High-concentration PV using III-V solar cells," Conference Record of the 2006 IEEE 4th World Conference on Photovoltaic Energy Conversion, Waikoloa, Hawaii, May 7-12, 2006; 6 pgs.

Bett et al., "The Needs for Industrialization of CPV Technologies," 4th International Conference on Solar Concentrators for the Generation of Electricity or Hydrogen, Mar. 12-16, 2007, San Lorenzo de El Escorial, Spain, 6 pgs.

Bohmer et al., "Autonomous Polygeneration Solar Concentrator," 4th International Conference on Solar Concentrators for the Generation of Electricity or Hydrogen, Mar. 12-16, 2007, San Lorenzo de El Escorial, Spain, 2 pgs.

Bosi et al., "The Potential of III-V Semiconductors as Terrestrial Photovoltaic Devices," Prog. Photovolt. Res. Appl. 2007; 15:51-68. Published online Jun. 19, 2006.

Brandhorst Jr. et al., "The past, present and future of space photovoltaics," Conference Record of the 2006 IEEE 4th World Conference on Photovoltaic Energy Conversion, Waikoloa, Hawaii, May 7-12, 2006; 6 pgs.

Cancro et al, "Field Testing of the PhoCUS Solar Tracker by Means of a Novel Optoelectronic Device," 4th International Conference on Solar Concentrators for the Generation of Electricity or Hydrogen, Mar. 12-16, 2007, San Lorenzo de El Escorial, Spain, 5 pgs.

Castro et al., "Guascor Foton: Contribution of the Manufacturing of Concentrator PV Systems," 4th International Conference on Solar Concentrators for the Generation of Electricity or Hydrogen, Mar. 12-16, 2007, San Lorenzo de El Escorial, Spain, 4 pgs.

Charache et al., "Moss-Burstein and Plasma Reflection Characteristics of Heavily Doped n-type $In_xGa_{1-x}As$ and $InP_yAs_{1-y}$," J. Appl. Phys., Jul. 1999; 86(1):452-458.

Chellini et al., "Inverters response time with concentration PV systems," 4th International Conference on Solar Concentrators for the Generation of Electricity or Hydrogen, Mar. 12-16, 2007, San Lorenzo de El Escorial, Spain, 4 pgs.

Chemisana et al., "Effect of a secondary linear concentrator on the Si solar cell electrical parameters," 4th International Conference on Solar Concentrators for the Generation of Electricity or Hydrogen, Mar. 12-16, 2007, San Lorenzo de El Escorial, Spain, 4 pgs.

Cole et al., "Front Contact Modeling of Monocrystalline Silicon Laser Grooved Buried Contact Solar Cells," 4th International Conference on Solar Concentrators for the Generation of Electricity or Hydrogen, Mar. 12-16, 2007, San Lorenzo de El Escorial, Spain, 4 pgs.

Conference Record of the 2006 IEEE 4th World Conference on Photovoltaic Energy Conversion, Waikoloa, Hawaii, May 7-12, 2006; 1 pg.

Connolly, "Mirrored strain-balanced quantum well concentrator cells in the radiative limit," $4^{th}$ International Conference on Solar Concentrators for the Generation of Electricity or Hydrogen, Mar. 12-16, 2007, San Lorenzo de El Escorial, Spain, 4 pgs.

Cotal et al., "Outdoor Operation of GaInP/GaAs/Ge Triple Junction Concentrator Solar Cells Up to 1000 Suns," 3rd World Conference on Photovoltaic Energy Conversion, Osaka, Japan, May 11-18, 2003; 4 pgs.

Cotal et al., "Temperature dependence of the IV parameters from triple junction GaInP/InGaAs/Ge concentrator solar cells," Conference Record of the 2006 IEEE 4th World Conference on Photovoltaic Energy Conversion, Waikoloa, Hawaii, May 7-12, 2006; pp. 845-848.

Cotal et al., "The effects of chromatic aberration on the performance of GaInP/GaAs/Ge concentrator solar cells from Fresnel optics," Conference Record of the Thirty-First IEEE Photovoltaic Specialist Conference, Lake Buena Vista, FL, Jan. 3-7, 2005; pp. 747-50.

Cowley et al., "Acceptance angle requirements for point focus CPV Systems," 4th International Conference on Solar Concentrators for the Generation of Electricity or Hydrogen, Mar. 12-16, 2007, San Lorenzo de El Escorial, Spain, 4 pgs.

Dallakyan et al., "Mirror Reflecting Cost Effective PV Solar Energy Concentrating System," 4th International Conference on Solar Concentrators for the Generation of Electricity or Hydrogen, Mar. 12-16, 2007, San Lorenzo de El Escorial, Spain, 3 pgs.

Diaz et al., "PV Systems Based on Very High Concentration: Isofoton Approach for Reaching the Market," 4th International Conference on Solar Concentrators for the Generation of Electricity or Hydrogen, Mar. 12-16, 2007, San Lorenzo de El Escorial, Spain, 4 pgs.

Diaz et al., "ISOSIM: A Multijunction Solar Cell Simulation Program," 4th International Conference on Solar Concentrators for the Generation of Electricity or Hydrogen, Mar. 12-16, 2007, San Lorenzo de El Escorial, Spain, 3 pgs.

Dimroth et al., "High-efficiency solar cells from III-V compound semiconductors," Phys. Status Solid. (c), Mar. 2006; 3(3):373-379.

Dimroth et al., "3-6 junction photovoltaic cells for space and terrestrial concentrator applications," Conference Record of the Thirty-First IEEE Photovoltaic Specialist Conference, Lake Buena Vista, FL, Jan. 3-5, 2005; pp. 525-529.

Dimroth et al., "Hydrogen production in a PV concentrator using III-V multi-junction solar cells," Conference Record of the 2006 IEEE 4th World Conference on Photovoltaic Energy Conversion, Waikoloa, Hawaii, May 7-12, 2006; pp. 640-643.

Dominguez et al., "Characterization of a new solar simulator for concentrator PV modules," $4^{th}$ International Conference on Solar Concentrators for the Generation of Electricity or Hydrogen, Mar. 12-16, 2007, San Lorenzo de El Escorial, Spain, 4 pgs.

Dominguez et al., "Spectral characterization of mini concentrator optics for its use with MJ cells," Conference Record of the 2006 IEEE 4th World Conference on Photovoltaic Energy Conversion, Waikoloa, Hawaii, May 7-12, 2006; 4 pgs.

Eames et al., "The Prediction of the Thermal Behaviour of a Low Concentration Non-Imaging Asymmetric Dielectric Concentrator for Building Facade Applications," 4th International Conference on Solar Concentrators for the Generation of Electricity or Hydrogen, Mar. 12-16, 2007, San Lorenzo de El Escorial, Spain, 4 pgs.

(56) References Cited

OTHER PUBLICATIONS

Faiman et al., "Natural sunlight tests at PETAL, of a trial MIM string at concentrations up to 1000X," Conference Record of the 2006 IEEE 4th World Conference on Photovoltaic Energy Conversion, Waikoloa, Hawaii, May 7-12, 2006; 4 pgs.

Faiman et al., "On the survival qualities of an un-encapsulated GaAs dense array Cpv module from 1X-1,000X under outdoor tests in the Negev Desert," 4th International Conference on Solar Concentrators for the Generation of Electricity or Hydrogen, Mar. 12-16, 2007, San Lorenzo de El Escorial, Spain, 4 pgs.

Fatemi et al., "Production of Very High-Efficiency Advanced Triple-Junction (Atj) Space Solar Cells at Emcore Photovoltaics," presented at the 2003 Space Power Workshop, Torrance, Ca, Apr. 24, 2003; 23 pgs.

Feltrin et al., "Material challenges for terawatt level deployment of photovoltaics," Conference Record of the Thirty-First IEEE Photovoltaic Specialist Conference, Lake Buena Vista, Fl, Jan. 3-5, 2005; 4 pgs.

"Flatcon® Technology" datasheet [online], Concentrix Solar GmbH, Germany, copyright 2007. Retrieved from the Internet on Nov. 11, 2007: <URL:http://www.concentrixsolar.de/cms/english-flatcontechnology.html>; 2 pgs.

Flores et al., "GaAs Solar Cells on Si Substrates for Concentrator Systems," $20^{th}$ European Photovoltaic Solar Energy Conference, Barcelona, Spain, Jun. 6-10, 2005; 6 pgs.

Fraas et al., "Toward 40% and higher solar cells in a new Cassegrainian PV module," Conference Record of the 31st IEEE Photovoltaic Specialists Conference, Lake Buena Vista, FL, Jan. 3-5, 2005; pp. 751-753.

Fraas et al., "Demonstration of a 33% efficient Cassegrainian solar module," Conference Record of the 2006 IEEE 4th World Conference on Photovoltaic Energy Conversion, Waikoloa, Hawaii, May 7-12, 2006; pp. 679-682.

Fraas et al., "Possible Improvements in the Cassegrainian PV Module," 4th International Conference on Solar Concentrators for the Generation of Electricity or Hydrogen, Mar. 12-16, 2007, San Lorenzo de El Escorial, Spain, 4 pgs.

Fraas et al., "Start-Up of First 100 kW System in Shanghai with 3-Sun PV Mirror Modules," $4^{th}$ International Conference on Solar Concentrators for the Generation of Electricity or Hydrogen, Mar. 12-16, 2007, San Lorenzo de El Escorial, Spain, 4 pgs.

Gabetta et al., "SJ and TJ GaAs concentrator solar cells on Si virtual wafers," Conference Record of the Thirty-First IEEE Photovoltaic Specialist Conference, Lake Buena Vista, FL, Jan. 3-5, 2005; pp. 850-853.

Galiana et al., "Comparison of 1D and 3D analysis of the front contact influence on GaAs concentrator solar cell performance," Sol. Energy Mater. Sol. Cells, Oct. 16, 2006; 90(16):2589-2604.

Galiana et al., "Influence of nucleation layers on MOVPE grown GaAs on Ge wafers for concentrator solar cells," Conference Record of the 2006 IEEE 4th World Conference on Photovoltaic Energy Conversion, Waikoloa, Hawaii, May 7-12, 2006; pp. 807-810.

Galiana et al., "A 3-D model for concentrator solar cells based on distributed circuit units," IEEE Trans. Electron Devices, Dec. 2005; 52(12):2552-2558.

Galiana et al., "A comparative study of BSF layers for GaAs-based single-junction or multijunction concentrator solar cells," Semiconductor Science and Technology, Oct. 2006; 21(10):1387-1392.

Garboushian et al., "A Novel High-Concentration PV Technology for Cost Competitive Utility Bulk Power Generation," Proc. 1st World Conference on Photovoltaic Energy Conversion, Hawaii, Dec. 5-9, 1994; pp. 1060-1063.

Garcia et al., "Choices for the epitaxial growth of GaInP/GaAs dual junction concentrator solar cells," 2005 Spanish Conference on Electron Devices, Tarragona, Spain, Feb. 2-4, 2005; 4 pgs.

Garcia et al., "Specific growth and characterization issues in multijunction solar cells for concentrations above 1000 suns," Conference Record of the 2006 IEEE 4th World Conference on Photovoltaic Energy Conversion, Waikoloa, Hawaii, May 7-12, 2006; pp. 830-833.

Geisz et al., "Toward a monolithic lattice-matched III-V on silicon tandem solar cell," $19^{th}$ European PV Solar Energy Conference and Exhibit, Paris, France, Jun. 7-11, 2004, 7 pgs.

Gonzalez et al., "Analysis of the degradation of high concentrator III-V solar cells," 2005 Spanish Conference on Electron Devices, Tarragona, Spain, Feb. 2-4, 2005, 4 pgs.

Gonzalez, "III-V High Concentrator Solar Cells: Assessing the Reliability of a New Product," 4th International Conference on Solar Concentrators for the Generation of Electricity or Hydrogen, Mar. 12-16, 2007, San Lorenzo de El Escorial, Spain, 4 pgs.

Gordon et al., "Towards a >33% Efficient Photovoltaic Module," 4th International Conference on Solar Concentrators for the Generation of Electricity or Hydrogen, Mar. 12-16, 2007, San Lorenzo de El Escorial, Spain, 4 pgs.

Gordon et al, "Amonix 6th Generation HCPV System," 4th International Conference on Solar Concentrators for the Generation of Electricity or Hydrogen, Mar. 12-16, 2007, San Lorenzo de El Escorial, Spain, 4 pgs.

Grilikhes, "The new approach to design of Fresnel lens sunlight concentrator," 4th International Conference on Solar Concentrators for the Generation of Electricity or Hydrogen, Mar. 12-16, 2007, San Lorenzo de El Escorial, Spain, 4 pgs.

Guter et al. "Tunnel Diodes for III-V Multi-junction Solar Cells," Proc. $20^{th}$ European Photovoltaic Solar Energy Conference and Exhibition, Barcelona, Spain, Jun. 6-10, 2005, 4 pgs.

Harwood et al., "Receiver development for rooftop concentrator applications," 4th International Conference on Solar Concentrators for the Generation of Electricity or Hydrogen, Mar. 12-16, 2007, San Lorenzo de El Escorial, Spain, 4 pgs.

Hayashi et al., "Large Scale Commercialization and Marketing Opportunities for Cost Effective Concentrator PV," 4th International Conference on Solar Concentrators for the Generation of Electricity or Hydrogen, Mar. 12-16, 2007, San Lorenzo de El Escorial, Spain, 3 pgs.

Heasman et al., "Development of laser grooved buried contact solar cells for use at concentration factors up to 100X," 4th International Conference on Solar Concentrators for the Generation of Electricity or Hydrogen, Mar. 12-16, 2007, San Lorenzo de El Escorial, Spain 4 pgs.

Hines, "Trends in the Economics of Solar Concentrators," 4th International Conference on Solar Concentrators for the Generation of Electricity or Hydrogen, Mar. 12-16, 2007, San Lorenzo de El Escorial, Spain, 6 pgs.

"Isofoton Concentration Systems" datasheet/manual [online], Isofoton, Malaga, Spain, Sep. 2003. Retrieved from the internet on Nov. 1, 2007: <URL:http://www.isofoton.com/technicalhtml/secciones/desarrolos/sistemas.asp>; 49 pgs.

Johnson Jr., "Hybrid Optic Design for Concentrator Panels," 4th International Conference on Solar Concentrators for the Generation of Electricity or Hydrogen, Mar. 12-16, 2007, San Lorenzo de El Escorial, Spain, 4 pgs.

Karvelas et al., "Mirrors based on total reflection for concentration PV panels," 4th International Conference on Solar Concentrators for the Generation of Electricity or Hydrogen, Mar. 12-16, 2007, San Lorenzo de El Escorial, Spain, 4 pgs.

Katz et al., "Mapping Concentrator Solar Cell Properties by Localized Irradiation at Ultrahigh Flux," 4th International Conference on Solar Concentrators for the Generation of Electricity or Hydrogen, Mar. 12-16, 2007, San Lorenzo de El Escorial, Spain, 4 pgs.

Khuchua et al., "Prospects for GaAs Solar Cells with a New Type Concentrator," 20th European Photovoltaic Solar Energy Conference, Jun. 6-10, 2005, Barcelona, Spain, 5 pgs.

King et al., "40% efficient metamorphic GaInP/GaInAs/Ge multijunction solar cells," Appl. Phys. Lett., 2007; 90(18):183516-1-183516-3. Published online May 4, 2007.

King et al., "Metamorphic and lattice-matched solar cells under concentration," Conference Record of the 2006 IEEE 4th World Conference on Photovoltaic Energy Conversion, Waikoloa, Hawaii, May 7-12, 2006; pp. 760-763.

(56) References Cited

OTHER PUBLICATIONS

King et al., "Metamorphic Concentrator Solar Cells with Over 40% Conversion Efficiency," 4th International Conference on Solar Concentrators for the Generation of Electricity or Hydrogen, Mar. 12-16, 2007, San Lorenzo de El Escorial, Spain, 4 pgs.

King et al. "High-efficiency space and terrestrial multijunction solar cells through bandgap control in cell structures," Conference Records of the 29th IEEE Photovoltaic Specialist Conference, New Orleans, LA, May 19, 2002; pp. 776-781.

Kinsey et al., "Multijunction solar cells for dense-array concentrators," Conference Record of the 2006 IEEE 4th World Conference on Photovoltaic Energy Conversion, Waikoloa, Hawaii, May 7-12, 2006; 3 pgs.

Kippelen, "Organic Photovoltaics: Ground-Based Telescopes for the 21st Century," Optics & Photonics News, Oct. 2007, pp. 28-33.

Klotz et al, "Integrated Parabolic Trough (IPT) for Low Concentration PV Systems," 4th International Conference on Solar Concentrators for the Generation of Electricity or Hydrogen, Mar. 12-16, 2007, San Lorenzo de El Escorial, Spain, 4 pgs.

Korech et al., "High-Flux Characterization of Ultra-Small Triple-Junction Concentrator Solar Cells," 4th International Conference on Solar Concentrators for the Generation of Electricity or Hydrogen, Mar. 12-16, 2007, San Lorenzo de El Escorial, Spain, 4 pgs.

Kotsovos et al., "Crystalline silicon solar cell design optimized for concentrator applications," 4th International Conference on Solar Concentrators for the Generation of Electricity or Hydrogen, Mar. 12-16, 2007, San Lorenzo de El Escorial, Spain, 4 pgs.

Kribus et al., "Practical cogeneration with concentrating PV," 4th International Conference on Solar Concentrators for the Generation of Electricity or Hydrogen, Mar. 12-16, 2007, San Lorenzo de El Escorial, Spain, 4 pgs.

Kurtz et al., "A New GaInP/GaAs/GaInAs, Triple-Bandgap, Tandem Solar Cell for High-Efficiency Terrestrial Concentrator Systems," Report No. NREL/CP-520-38997; Presented at the 2005 DOE Solar Energy Technologies Program Review Meeting, Nov. 7-10, 2005, Denver, CO; 5 pages.

Kurtz et al., "Using MOVPE growth to generate tomorrow's solar electricity," J. Cryst. Growth, Jan. 2007; 298:748-753.

Kurtz et al., "A Comparison of Theoretical and Experimental Efficiencies of Concentrator Solar Cells," 4th International Conference on Solar Concentrators for the Generation of Electricity or Hydrogen, Mar. 12-16, 2007, San Lorenzo de El Escorial, Spain, 6 pgs.

Kusek et al., "Description and Performance of the MicroDish Concentrating Photovoltaic System," 4th International Conference on Solar Concentrators for the Generation of Electricity or Hydrogen, Mar. 12-16, 2007, San Lorenzo de El Escorial, Spain, 4 pgs.

Lasich et al., "Opportunities for widespread implementation of concentrator photovoltaic (CPV) Systems," 4th International Conference on Solar Concentrators for the Generation of Electricity or Hydrogen, Mar. 12-16, 2007, San Lorenzo de El Escorial, Spain, 6 pgs.

Lee et al., "Field test and analysis: the behavior of 3-J concentrator cells under the control of cell temperature," Conference Record of the Thirty-First IEEE Photovoltaic Specialist Conference, Lake Buena Vista, FL, Jan. 3-5, 2005, pp. 754-757.

Lerchenmuller et al., "From FLATCON® Pilot Systems to the first Power Plant," 4th International Conference on Solar Concentrators for the Generation of Electricity or Hydrogen, Mar. 12-16, 2007, San Lorenzo de El Escorial, Spain, 4 pgs.

Lerchenmuller et al., "Cost and Market Perspectives for FLATCON®-Systems," International Conference on Solar Concentrators for the Generation of Electricity or Hydrogen, Scottsdale, AZ, May 1-5, 2005, 3 pgs.

Leutz, "Nonimaging Flat Fresnel Lenses," 4th International Conference on Solar Concentrators for the Generation of Electricity or Hydrogen, Mar. 12-16, 2007, San Lorenzo de El Escorial, Spain, 4 pgs.

Leutz et al., "Segmented Cone Concentrators: Optical Design," 4th International Conference on Solar Concentrators for the Generation of Electricity or Hydrogen, Mar. 12-16, 2007, San Lorenzo de El Escorial, Spain, 4 pgs.

Li et al., "Development of 1.25 eV InGaAsN for Triple Junction Solar Cells," 28th IEEE Photovoltaic Specialists Conference, Anchorage, Alaska, Sep. 15-22, 2000, 4 pgs.

Loeckenhoff et al., "1000 sun, compact receiver based on monolithic interconnected modules (MIMS)," Conference Record of the 2006 IEEE 4th World Conference on Photovoltaic Energy Conversion, Waikoloa, Hawaii, May 7-12, 2006; pp. 737-740.

Luque et al., "Concentrators: The Path to Commercialization of the Novel Sophisticated Ultra High Efficiency Solar Cells," 4th International Conference on Solar Concentrators for the Generation of Electricity or Hydrogen, Mar. 12-16, 2007, San Lorenzo de El Escorial, Spain, 6 pgs.

Luque et al., Ed. Sections 9.8 and 9.9 "High-Efficiency III-V Multijunction Solar Cells," and Chapter 11 "Photovoltaic Concentrators," *Handbook of Photovoltaic Science and Engineering*, John Wiley & Sons, Ltd., Hoboken, NJ, Jul. 7, 2003; 64 pgs.

Luque et al., "Fullspectrum: a new PV wave making more efficient use of the solar spectrum," Sol. Energy Mater. Sol. Cells, May 2005; 87(1-4):467-479.

Luque-Heredia et al., "CPV Tracking Systems: Performance Issues, Specification and Design," 4th International Conference on Solar Concentrators for the Generation of Electricity or Hydrogen, Mar. 12-16, 2007, San Lorenzo de El Escorial, Spain, 7 pgs.

Lynch et al., "Spectral response and I-V characteristics of large well number multi quantum well solar cells," Journal of Materials Science, Mar. 2005; 40(6):1445-1449.

Madrid et al., "Investigation of the efficiency boost due to spectral concentration in a quantum-dot based luminescent concentrator," Conference Record of the 2006 IEEE 4th World Conference on Photovoltaic Energy Conversion, Waikoloa, Hawaii, May 7-12, 2006; 4 pgs.

Mallick et al., "Optical Performance Predictions for a High Concentration Point Focus Photovoltaic System," 4th International Conference on Solar Concentrators for the Generation of Electricity or Hydrogen, Mar. 12-16, 2007, San Lorenzo de El Escorial, Spain, 4 pgs.

Martinez et al., "Prediction of PV concentrators energy production: Influence of wind in the cooling mechanisms. First steps," 4th International Conference on Solar Concentrators for the Generation of Electricity or Hydrogen, Mar. 12-16, 2007, San Lorenzo de El Escorial, Spain, 4 pgs.

Mazzer et al., "Progress in quantum well solar cells," Thin Solid Films, Jul. 26, 2006; 511-512:76-83.

McConnell et al., "Multijunction photovoltaic technologies for high-performance concentrators," Conference Record of the 2006 IEEE 4th World Conference on Photovoltaic Energy Conversion, Waikoloa, Hawaii, May 7-12, 2006; 4 pgs.

McConnell et al., "Concentrator Photovoltaic Standards," 4th International Conference on Solar Concentrators for the Generation of Electricity or Hydrogen, Mar. 12-16, 2007, San Lorenzo de El Escorial, Spain, 4 pgs.

McMahon et al., "Outdoor Testing of GaInP$_2$/GaAs Tandem Cells with Top Cell Thickness Varied," International Conference on Solar Concentrators for the Generation of Electricity or Hydrogen, Scottsdale, Arizona, May 1-5, 2005, 4 pgs.

Meusel et al., "Characterization of monolithic III-V multi junction solar cells—challenges and application," Sol. Energy Mater. Sol. Cells, Nov. 23, 2006; 90:3268-3275.

Morilla et al., "Technology Improvements in Buried Contact Cells Optimised for Concentration Systems," 4th International Conference on Solar Concentrators for the Generation of Electricity or Hydrogen, Mar. 12-16, 2007, San Lorenzo de El Escorial, Spain, 4 pgs.

Newman et al., "Terrestrial Solar Cell Development at Emcore and Roadmap to Achieving Higher Performance," 4th International Conference on Solar Concentrators for the Generation of Electricity or Hydrogen, Mar. 12-16, 2007, San Lorenzo de El Escorial, Spain, 4 pgs.

(56) References Cited

OTHER PUBLICATIONS

Nishioka et al., "Annual output estimation of concentrator photovoltaic systems using high-efficiency InGaP/InGaAs/Ge triple-junction solar cells based on experimental solar cell's characteristics and field-test meteorological data," Sol. Energy Mater. Sol. Cells, Jan. 6, 2006; 90(1):57-67.

Nishioka et al., "Evaluation of InGaP/InGaAs/Ge triple-junction solar cell and optimization of solar cell's structure focusing on series resistance for high-efficiency concentrator photovoltaic systems," Sol. Energy Mater. Sol. Cells, May 23, 2006; 90(9):1308-1321.

Nishioka et al., "Evaluation of temperature characteristics of high-efficiency InGaP/InGaAs/Ge triple junction solar cells under concentration," Sol. Energy Mater. Sol. Cells, Jan. 2005; 85:429-436.

Nitz et al, "Indoor Characterization of Fresnel Type Concentrator Lenses," 4th International Conference on Solar Concentrators for the Generation of Electricity or Hydrogen, Mar. 12-16, 2007, San Lorenzo de El Escorial, Spain, 4 pgs.

O'Neill, "Advances in Color-Mixing Lens/Multi-junction Cell (CML/MJC) Concentrators for Space and Ground Power," 4th International Conference on Solar Concentrators for the Generation of Electricity or Hydrogen, Mar. 12-16, 2007, San Lorenzo de El Escorial, Spain, 4 pgs.

Ortabasi et al., "Dish/Photovoltaics Cavity Converter (PVCC) System for Ultimate Solar-to-Electricity Conversion Efficiency General Concept and First Performance Predictions," 29th IEEE Photovoltaic Specialists Conference, New Orleans, LA, May 19, 2002, 5 pgs.

Parretta et al., "Fluxmeter for Parabolic Trough Solar Concentrators," 4th International Conference on Solar Concentrators for the Generation of Electricity or Hydrogen, Mar. 12-16, 2007, San Lorenzo de El Escorial, Spain, 4 pgs.

Parretta et al., "Fluxmeter for Point-Focus Solar Concentrators," 4th International Conference on Solar Concentrators for the Generation of Electricity or Hydrogen, Mar. 12-16, 2007, San Lorenzo de El Escorial, Spain, 4 pgs.

Pereles et al., "High Concentration PV System," 4th International Conference on Solar Concentrators for the Generation of Electricity or Hydrogen, Mar. 12-16, 2007, San Lorenzo de El Escorial, Spain, 3 pgs.

Perez et al., "Multi-Trackers Systems. Calculation of losses due to self-shadowing," $4^{th}$ International Conference on Solar Concentrators for the Generation of Electricity or Hydrogen, Mar. 12-16, 2007, San Lorenzo de El Escorial, Spain, 4 pgs.

Qiu et al., "Thermophotovoltaic power generation systems using natural gas-fired radiant burners," Sol Energy Mater. Sol. Cells, Apr. 16, 2007; 91(7):588-596.

Rasello et al., "Comparison between Different Solar Concentrators as regards to the Electric Generation," 4th International Conference on Solar Concentrators for the Generation of Electricity or Hydrogen, Mar. 12-16, 2007, San Lorenzo de El Escorial, Spain, 4 pgs.

Rey-Stolle et al., "Assessment of a low-cost gold-free metallization for III-V high concentrator solar cells," Solar Energy Materials and Solar Cells, May 23, 2007; 91(9):847-850.

Roca et al., "Development and Performance Analysis of the PhoCUS C-Module, 4th International Conference on Solar Concentrators for the Generation of Electricity or Hydrogen," Mar. 12-16, 2007, San Lorenzo de El Escorial, Spain, 4 pgs.

Rubin et al., "DAY4™ PV Receivers and Heat Sinks for Sun Concentration Applications," $4^{th}$ International Conference on Solar Concentrators for the Generation of Electricity or Hydrogen, Mar. 12-16, 2007, San Lorenzo de El Escorial, Spain, 4 pgs.

Rubio et al., "Establishment of the Institute of Concentration Photovoltaic Systems—ISFOC," 4th International Conference on Solar Concentrators for the Generation of Electricity or Hydrogen, Mar. 12-16, 2007, San Lorenzo de El Escorial, Spain, 2 pgs.

Rumyantsev et al., "Terrestrial concentrator PV modules based on GaInP/GaAs/Ge TJ cells and minilens panels," Conference Record of the 2006 IEEE 4th World Conference on Photovoltaic Energy Conversion, Waikoloa, Hawaii, May 7-12, 2006; pp. 632-635.

Rumyantsev et al., "Solar concentrator modules with fresnel lens panels", 4th International Conference on Solar Concentrators for the Generation of Electricity or Hydrogen, Mar. 12-16, 2007, San Lorenzo de El Escorial, Spain, 4 pgs.

Rumyantsev et al., "Indoor Characterization of Multijunction Concentrator Cells Under Flash Illumination with Variable Spectrum," 4th International Conference on Solar Concentrators for the Generation of Electricity or Hydrogen, Mar. 12-16, 2007, San Lorenzo de El Escorial, Spain, 4 pgs.

Sarno et al., "Enea's Experience on the PV-Concentrators Technology: The PhoCUS Project," 4th International Conference on Solar Concentrators for the Generation of Electricity or Hydrogen, Mar. 12-16, 2007, San Lorenzo de El Escorial, Spain, 4 pgs.

Sharps et al., "AlGaAs/InGaAlP Tunnel Junctions for Multi-junction Solar Cells," 28th IEEE Photovoltaic Specialists Conference, Anchorage, Alaska, Sep. 15-22, 2000; pp. 1185-1188.

Sharps et al., "Electron and Proton Radiation Study of GaInP$_2$/GaAs/Ge Solar Cell," $17^{th}$ European Photovoltaic Solar Energy Conference, Munich, Germany, Oct. 22-26, 2001, 4 pgs.

Sharps et al., "Ultra high-efficiency advanced triple junction (ATJ) solar cell production at Emcore Photovoltaics," $37^{th}$ Intersociety Energy Conversion Engineering Conference, Jul. 29-31, 2002, Abstract only, 1 pg.

Sharps et al., "Modeling and Testing of Multi-junction Solar Cell Reliability," Presented at the 2003 Space Power Workshop, Torrance, CA, Apr. 25, 2003, Emcore Corporation, 19 pgs.

Sharps et al., "Proton and Electron Radiation Analysis of GaInP$_2$/GaAs Solar Cells," $28^{th}$ IEEE Photovoltaic Specialists Conference, Anchorage, Alaska, Sep. 15-22, 2000, 4 pgs.

Sherif et al., "First demonstration of multi-junction receivers in a grid-connected concentrator module," Conference Record of the Thirty-First IEEE Photovoltaic Specialist Conference, Lake Buena Vista, FL, Jan. 3-7, 2005; pp. 635-638.

Shin et al., "The Development of a 5kW HCPV Systems at INER," 4th International Conference on Solar Concentrators for the Generation of Electricity or Hydrogen, Mar. 12-16, 2007, San Lorenzo de El Escorial, Spain, 3 pgs.

Shvarts et al., "Space Fresnel lens concentrator modules with triple-junction solar cells," Conference Record of the Thirty-First IEEE Photovoltaic Specialist Conference, Lake Buena Vista, FL, Jan. 3-7, 2005; pp. 818-821.

Shvarts et al., "Indoor Characterization of the Multijunction III-V Solar Cells and Concentrator Modules," European Photovoltaic Solar Energy Conference, Barcelona, Spain, Jun. 6-10, 2005, 4 pgs.

Siefer et al., "Calibration of III-V concentrator cells and modules," Conference Record of the 2006 IEEE 4th World Conference on Photovoltaic Energy Conversion, Waikoloa, Hawaii, May 7-12, 2006; pp. 745-748.

Sinharoy et al., "Progress in the Development of Metamorphic Multi-Junction III-V Space Solar Cells," Prog. Photovolt. Res. Appl., Sep. 2002; 10(6):427-432. Published online Aug. 27, 2002.

Slade et al., "High Efficiency Solar Cells for Concentrator Systems: Silicon or Multi-Junction?" SPIE Optics and Photonics, San Diego, CA, Aug. 2005; 8 pgs.

Slade et al., "A Comparison of Concentrator Cell Technologies," 4th International Conference on Solar Concentrators for the Generation of Electricity or Hydrogen, Mar. 12-16, 2007, San Lorenzo de El Escorial, Spain, 4 pgs.

"Sol Focus SF-CPV-2005 High Efficiency Concentrator PV Panel" datasheet, Sol Focus, Inc., Palo Alto, CA. Copyright 2007. Retrieved from the Internet on Nov. 1, 2007: <URL:http://www.solfocus.com/technology_gen1.html>; 7 pgs.

Stan et al., "InGaP/InGaAs/Ge high concentration solar cell development at Emcore," Conference Record of the Thirty-first IEEE Photovoltaic Specialists Conference, Lake Buena Vista, FL, Jan. 3-7, 2005, pp. 770-773.

Stan et al., "27.5% Efficiency InGaP/InGaAs/Ge Advanced Triple Junction (ATJ) Space Solar Cells for High Volume Manufacturing," 29th IEEE Photovoltaic Specialists Conference, New Orleans, May 19, 2002, 4 pgs.

Stefrancich et al., "Optical tailoring of flat faceted collector for optimal flux distribution on CPV receiver," 4th International Con-

(56) References Cited

OTHER PUBLICATIONS ference on Solar Concentrators for the Generation of Electricity or Hydrogen, Mar. 12-16, 2007, San Lorenzo de El Escorial, Spain, 4 pgs.

Stone et al., "Design & Performance of the Amonix High Concentration Solar PV System," ASES/ASME National Solar Energy Conference, Reno, NV, Jun. 15-20, 2002, 7 pgs.

Stone et al., "Operation of 350 kW of Amonix High Concentration PV Systems at Arizona Public Service," ASME 2003 International Solar Energy Conference, Kohala Coast, Hawaii, Mar. 15-18, 2003, 6 pgs.

Swinkels et al., "Energy Conversion of Concentrated Near Infrared Radiation in a Solar Greenhouse," 4th International Conference on Solar Concentrators for the Generation of Electricity or Hydrogen, Mar. 12-16, 2007, San Lorenzo de El Escorial, Spain, 4 pgs.

Symko-Davies et al., "Research Initiatives on High-Efficiency Low-Cost Concentrator Photovoltaics," 4th International Conference on Solar Concentrators for the Generation of Electricity or Hydrogen, Mar. 12-16, 2007, San Lorenzo de El Escorial, Spain, 4 pgs.

Takamoto et al., "InGaP/GaAs-based multijunction solar cells," Prog Photovoltaics Res Appl; Sep. 2005; 13(6):495-511.

Takamoto et al., "Concentrator compound solar cells," Sharp Technical Journal, Dec. 2005; 93:49-53.

Takamoto et al., "Future development of InGaP/(In)GaAs based multijunction solar cells," Conference Record of the Thirty-First IEEE Photovoltaic Specialist Conference, Lake Buena Vista, FL, Jan. 3-7, 2005, pp. 519-524.

Tomita et al., "Blazing a new path to the future," Conference Record of the 2006 IEEE 4th World Conference on Photovoltaic Energy Conversion, Waikoloa, Hawaii, May 7-12, 2006; pp. 2451-2453.

Tripanagnostopoulos, "Linear Fresnel Lenses With Photovoltaics for Cost Effective Electricity Generation and Solar Control of Buildings," 4th International Conference on Solar Concentrators for the Generation of Electricity or Hydrogen, Mar. 12-16, 2007, San Lorenzo de El Escorial, Spain, 4 pgs.

Tzeng et al., "Status of concentration type III-V solar cell development at INER Taiwan," 4th International Conference on Solar Concentrators for the Generation of Electricity or Hydrogen, Mar. 12-16, 2007, San Lorenzo de El Escorial, Spain, 4 pgs.

Tzeng et al., "The development of an 1kW HCPV system at INER," Conference Record of the 2006 IEEE 4th World Conference on Photovoltaic Energy Conversion, Waikoloa, Hawaii, May 7-12, 2006; pp. 648-650.

Vallribera et al., "Technical highlights of a solar simulator for high concentration PV modules," 4th International Conference on Solar Concentrators for the Generation of Electricity or Hydrogen, Mar. 12-16, 2007, San Lorenzo de El Escorial, Spain, 3 pgs.

van Reisen et al., "Degradation study of III-V solar cells for concentrator applications," Prog. Photovolt., Res. Appl., Aug. 2005; 13(5):369-380.

Venkatasubramanian et al., "An Inverted-Growth Approach to Development of an IR-Transparent, High-Efficiency Al GaAs/GaAs Cascade Solar Cell," Conference Record of the 22$^{nd}$ IEEE Photovoltaic Specialists Conference, Las Vegas, NV, Oct. 7-11, 1991; pp. 93-98.

Verlinden et al., "Performance and reliability of multijunction III-V modules for concentrator dish and central receiver applications," Conference Record of the 2006 IEEE 4th World Conference on Photovoltaic Energy Conversion, Waikoloa, Hawaii, May 7-12, 2006; pp. 592-597.

Vivar et al., "Third Generation of Euclides System: First results and modelling of annual production in Ideoconte project test sites," 4th International Conference on Solar Concentrators for the Generation of Electricity or Hydrogen, Mar. 12-16, 2007, San Lorenzo de El Escorial, Spain, 4 pgs.

Vlasov et al., "TPV systems with solar powered tungsten emitters," Seventh World Conference on Thermophotovoltaic Generation of Electricity, AIP Conference Proceedings, Feb. 2007, vol. 890, pp. 327-334.

Vossier et al., "Experimental Test and Modelling of Concentrator Solar Cells Under Medium and High Fluxes," 4th International Conference on Solar Concentrators for the Generation of Electricity or Hydrogen, Mar. 12-16, 2007, San Lorenzo de El Escorial, Spain, 4 pgs.

Wanlass et al., GaInP/GaAs/GaInAs Monolithic Tandem Cells for High-Performance Solar Concentrators, International Conference on Solar Concentrators for the Generation of Electricity or Hydrogen, Scottsdale, AZ, May 1-5, 2005, 4 pgs.

Wanlass et al., "Lattice-Mismatched Approaches for High-Performance, III-V Photovoltaic Energy Converters," 31st IEEE Photovoltaics Specialists Conference and Exhibition, Lake Buena Vista, FL, Jan. 3-7, 2005, 9 pgs.

Winston, "Concentrator Optics for Photovoltaics," 4th International Conference on Solar Concentrators for the Generation of Electricity or Hydrogen, Mar. 12-16, 2007, San Lorenzo de El Escorial, Spain, 2 pgs.

Wu et al., "Optical Analysis of Asymmetric Compound Parabolic Photovoltaic Concentrators (ACPPVC) Suitable for Building Facade Integration," 4th International Conference on Solar Concentrators for the Generation of Electricity or Hydrogen, Mar. 12-16, 2007, San Lorenzo de El Escorial, Spain, 4 pgs.

Yamaguchi et al., "Super high-efficiency multi-junction and concentrator solar cells," Sol. Energy Mater. Sol. Cells, Nov. 23, 2006; 90(18-19):3068-3077.

Yamaguchi et al., "Super-high-efficiency multi-junction solar cells," Prog. Photovolt., Res. Appl., Mar. 2005; 13(2):125-132.

Yamaguchi et al., "Multi-junction III-V solar cells: current status and future potential," Sol. Energy, Jul. 2005; 79(1):78-85.

Yeh et al., "Hybrid mode tracking control mechanism used in HCPV tracker," 4th International Conference on Solar Concentrators for the Generation of Electricity or Hydrogen, Mar. 12-16, 2007, San Lorenzo de El Escorial, Spain, 4 pgs.

4th International Conference on Solar Concentrators for the Generation of Electricity or Hydrogen, Mar. 12-16, 2007, San Lorenzo de El Escorial, Spain. Sessions Index, 11 pgs.

Office Action dated Oct. 15, 2007 for U.S. Appl. No. 11/830,636.

Office Action dated Jan. 26, 2009 for U.S. Appl. No. 12/191,142.

Office Action dated Mar. 31, 2011 for U.S. Appl. No. 12/703,561.

Notice of Allowance dated Mar. 9, 2009 for U.S. Appl. No. 12/264,369.

European Search Report dated Mar. 10, 2009 for European Patent Application No. 08017412.1-1528.

Portuguese Search Report dated Jun. 2, 2008 for Portuguese Patent Application No. 103890.

Collection of Abstracts, vol. 1, Patent Literature (List of items abstracted as Search 1; 2804 pgs. in 4 parts.).

Collection of Abstracts, vol. 2, Non-Patent Literature (List of items abstracted as Search 2; 202 pgs.).

Collection of Abstracts, vol. 3, Patent Literature (List of items abstracted as Search 2; 554 pgs.).

Collection of Abstracts, vol. 4, Non-Patent Literature (List of items abstracted as Search 2; 306 pgs.).

* cited by examiner

ENCAPSULATED CONCENTRATED PHOTOVOLTAIC SYSTEM SUBASSEMBLY FOR III-V SEMICONDUCTOR SOLAR CELLS

RELATED APPLICATIONS

The disclosure of this application is related to co-pending U.S. application Ser. No. 12/485,684, filed on Jun. 16, 2009; co-pending U.S. application Ser. No. 12/246,295, filed on Oct. 6, 2008; U.S. application Ser. No. 12/069,642 filed on Feb. 11, 2008; U.S. application Ser. No. 12/254,369, filed on Nov. 4, 2008 which is a divisional of Ser. No. 12/069,642; U.S. application Ser. No. 11/849,033, filed on Aug. 31, 2007; U.S. application Ser. No. 11/830,576, filed on Jul. 30, 2007; and U.S. application Ser. No. 11/500,053, filed on Aug. 7, 2006, the contents of which are incorporated herein by reference in their entirety.

FIELD OF THE INVENTION

The present application is directed to a solar cell subassembly for use in a concentrator photovoltaic system, more particularly, to an encapsulated solar cell receiver including a solar cell, metallized ceramic substrate and a concentrator optical element.

BACKGROUND

Historically, solar power (both in space and terrestrially) has been predominantly provided by silicon solar cells. In the past several years, however, high-volume manufacturing of high-efficiency III-V compound semiconductor multijunction solar cells for space applications has enabled the consideration of this alternative technology for terrestrial power generation. Compared to silicon, III-V compound semiconductor multifunction cells are generally more radiation resistant and have greater energy conversion efficiencies, but they tend to cost more to manufacture. Some current III-V compound semiconductor multijunction cells have energy efficiencies that exceed 27%, whereas silicon technologies generally reach only about 17% efficiency. Under concentration, some current III-V compound semiconductor multijunction cells have energy efficiencies that exceed 37%.

Generally speaking, the multijunction cells are of n-on-p polarity and are composed of a vertical stack of InGaP/(In)GaAs/Ge semiconductor structures. The III-V compound semiconductor multijunction solar cell layers are typically grown via metal-organic chemical vapor deposition (MOCVD) on germanium (Ge) substrates. The use of the Ge substrate permits a junction to be formed between n- and p-type Ge, thereby utilizing the substrate for forming the bottom or low band gap subcell. The solar cell structures are typically grown on 100-mm diameter Ge wafers with an average mass density of about 86 mg/cm$^2$. In some processes, the epitaxial layer uniformity across a platter that holds 12 or 13 Ge substrates during the MOCVD growth process is better than 99.5%. The epitaxial wafers can subsequently be processed into finished solar cell devices through automated robotic photolithography, metallization, chemical cleaning and etching, antireflection (AR) coating, dicing, and testing processes. The n- and p-contact metallization is typically comprised of predominately Ag with a thin Au cap layer to protect the Ag from oxidation. The AR coating is a dual-layer $TiO_x/Al_2O_3$ dielectric stack, whose spectral reflectivity characteristics are designed to minimize reflection at the coverglass-interconnect-cell (CIC) or solar cell assembly (SCA) level, as well as, maximizing the end-of-life (EOL) performance of the cells.

In some compound semiconductor multijunction cells, the middle cell is an InGaAs cell as opposed to a GaAs cell. The indium concentration may be in the range of about 1.5% for the InGaAs middle cell. In some implementations, such an arrangement exhibits increased efficiency. The advantage in using InGaAs layers is that such layers are substantially better lattice-matched to the Ge substrate.

SUMMARY

According to an embodiment, a solar cell subassembly for converting solar energy to electricity includes an optical element defining an optical channel, a solar cell receiver comprising:
a support; a solar cell mounted on the support adjacent to the optical element and in the optical path of the optical channel, the solar cell comprising one or more III-V compound semiconductor layers and capable of generating in excess of 20 watts of peak DC power; and an encapsulant covering the support, the solar cell, and at least a portion of the exterior sides of the optical element.

In another aspect, the present invention provides a method of manufacturing a solar cell receiver, comprising: providing a support; mounting a solar cell comprising one or more III-V compound semiconductor layers and capable of generating in excess of 20 watts of peak DC power on the support; mounting an optical element defining an optical channel over the solar cell so that the solar cell is disposed in the optical path of the optical channel; and encapsulating the support, the solar cell, and at least a portion of the exterior sides of the optical element.

Of course, the present invention is not limited to the above features and advantages. Those skilled in the art will recognize additional features and advantages upon reading the following detailed description, and upon viewing the accompanying drawings.

DETAILED DESCRIPTION

Figure 1:
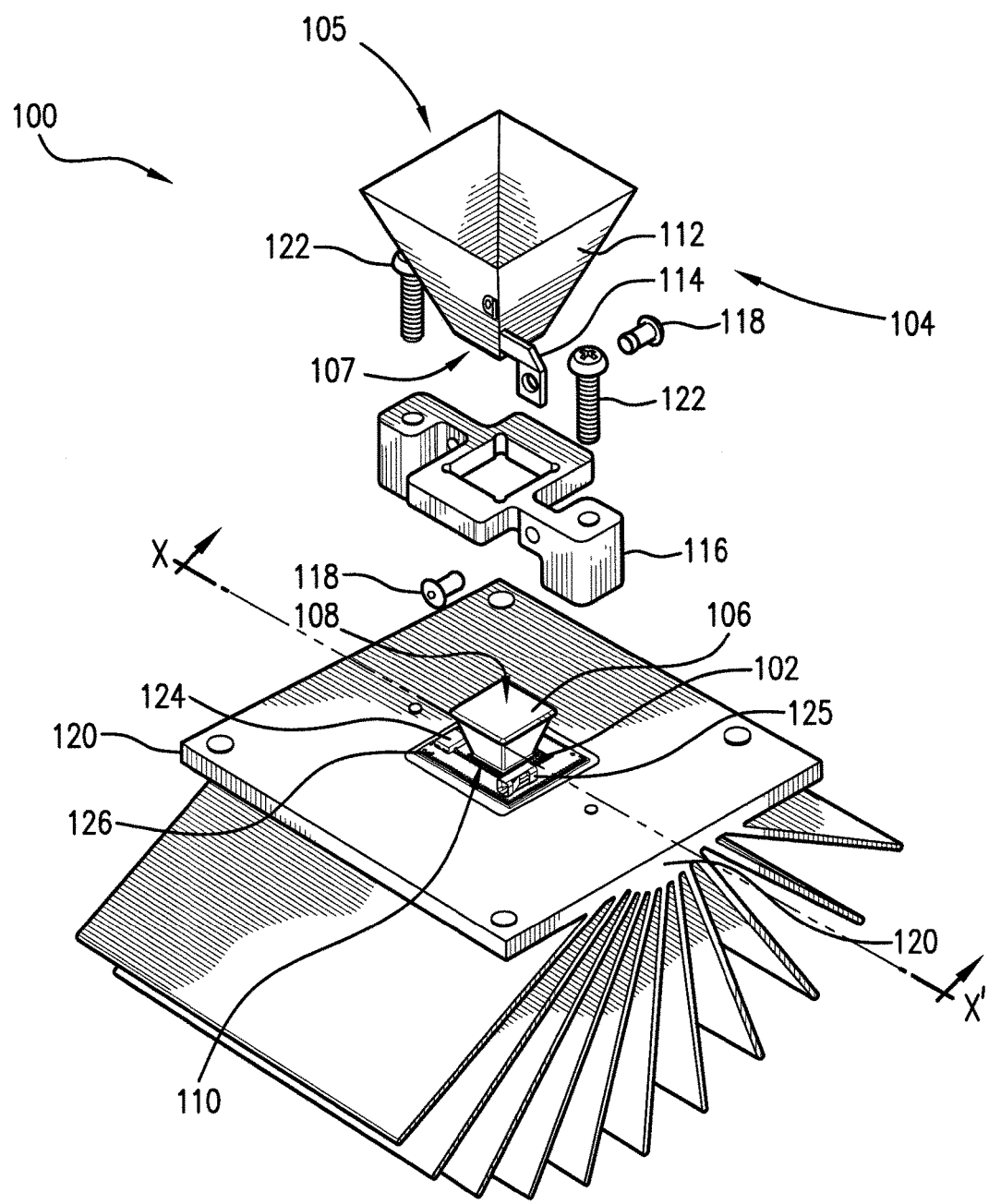
FIG. 1 is a partially exploded perspective view of an embodiment of a solar cell receiver including a solar cell, a metallized ceramic substrate and a heat sink.

Details of the present invention will now be described including exemplary aspects and embodiments thereof. Referring to the drawings and the following description, like reference numbers are used to identify like or functionally similar elements, and are intended to illustrate major features of exemplary embodiments in a highly simplified diagrammatic manner. Moreover, the drawings are not intended to depict every feature of the actual embodiment nor the relative dimensions of the depicted elements, and are not drawn to scale.

Solar cell receivers include a solar cell for converting solar energy into electricity. In various implementations described herein, a triple-junction III-V compound semiconductor solar cell is employed, but other types of solar cells could be used depending upon the application. Solar cell receivers often contain additional components, e.g., connectors for coupling to an output device or other solar cell receivers.

For some applications, a solar cell receiver may be implemented as part of a solar cell module. A solar cell module may include a solar cell receiver and a lens coupled to the solar cell receiver. The lens is used to focus received light onto the solar cell receiver. As a result of the lens, a greater concentration of solar energy can be received by the solar cell receiver. In some implementations, the lens is adapted to concentrate solar energy by a factor of 400 or more. For example, under 500-Sun concentration, 1 cm$^2$ of solar cell area produces the same amount of electrical power as 500 cm$^2$ of solar cell area would, without concentration. The use of concentration, therefore, allows substitution of cost-effective materials such as lenses and mirrors for the more costly semiconductor cell material. Two or more solar cell modules may be grouped together into an array. These arrays are sometimes referred to as "panels" or "solar panels."

FIG. 1 illustrates an embodiment of a solar cell receiver 100 including a solar cell 102. In one embodiment, the solar cell 102 is a triple-junction III-V compound semiconductor solar cell which comprises a top cell, a middle cell and a bottom cell arranged in series. In another embodiment, the solar cell 102 is a multifunction solar cell having n-on-p polarity and is composed of InGaP/(In)GaAs III-V compounds on a Ge substrate. In each case, the solar cell 102 is positioned to receive focused solar energy from a secondary optical element 104.

The secondary optical element 104 is positioned between the solar cell 102 and a primary focusing element (not shown) such as a lens. The secondary optical element 104 is generally designed to collect solar energy concentrated by the corresponding lens toward the upper surface of the solar cell 102. The secondary optical element 104 includes an entry aperture 105 that receives light beams from the corresponding lens and an exit aperture 107 that transmits the light beams to the solar cell 102. The secondary optical element 104 includes an intermediate region 112 between the apertures 105, 107. Under ideal conditions, the lens associated with the secondary optical element 104 focuses the light directly to the solar cell 102 without the light hitting against the secondary optical element 104.

In most circumstances, the lens does not focus light directly on the solar cell 102. This may occur due to a variety of causes, including but not limited to chromatic aberration of a refractive lens design, misalignment of the solar cell 102 relative to the lens during construction, misalignment during operation due to tracker error, structural flexing, and wind load. Thus, under most conditions, the lens focuses the light such that it reflects off the secondary optical element 104. The difference between an ideal setup and a misaligned setup may be a minor variation in the positioning of the lens of less than 1°.

The secondary optical element 104 therefore acts as a light spill catcher to cause more of the light to reach the solar cell 102 in circumstances when the corresponding lens does not focus light directly on the solar cell 102. The secondary optical element 104 can include a reflective multi-layer intermediate region such as the kind disclosed in U.S. patent application Ser. No. 12/402,814 filed on Mar. 12, 2009, the content of which is incorporated herein by reference in its entirety. The reflective multi-layer intermediate region can be formed from different materials and have different optical characteristics so that the reflectivity of the light beams off secondary optical element 104 and transmitted to the solar cell 102 optimizes the aggregate irradiance on the surface of the solar cell 102 over the incident solar spectrum. For example, in some implementations, the inner surface of the body 112 of the secondary optical element 104 can be coated with silver or another material for high reflectivity. In some cases, the reflective coating is protected by a passivation coating such as $SiO_2$ to protect the secondary optical element 104 against oxidation, tarnish or corrosion.

The body 112 of the secondary optical element 104 has one or more mounting tabs 114 for attaching the body 112 to a bracket 116 via one or more fasteners 118. The bracket 116 is provided for mounting the secondary optical element 104 to a heat sink 120 via one or more fasteners 122. The bracket 116 is thermally conductive so that heat energy generated by the secondary optical element 104 during operation can be transferred to the heat sink 120 and dissipated. As shown in this implementation, the secondary optical element 104 has four reflective walls. In other implementations, different shapes (e.g., three-sided to form a triangular cross-section) may be employed. The secondary optical element 104 can be made of metal, plastic, or glass or other materials.

Figure 2:
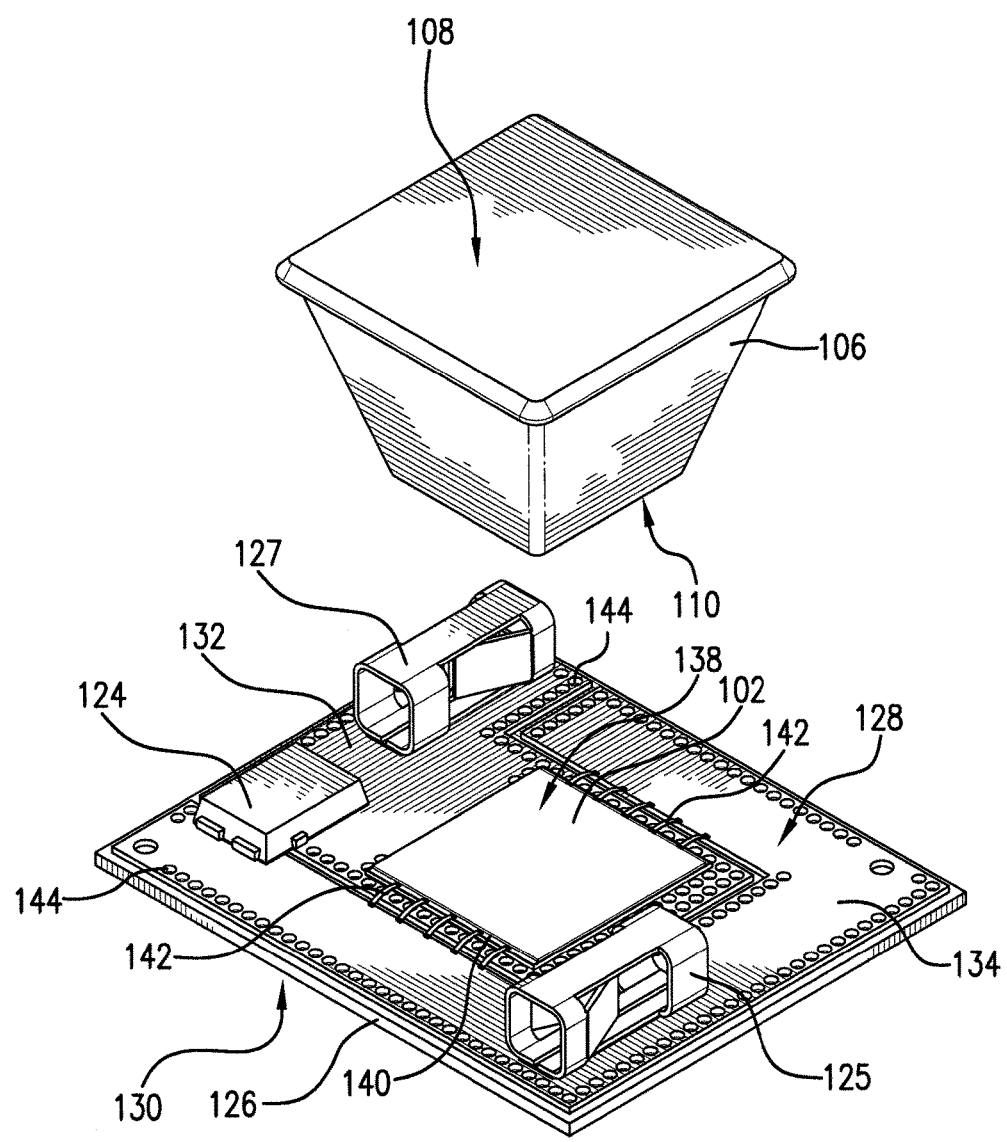
FIG. 2 shows the solar cell and the metallized ceramic substrate of FIG. 1 in more detail.

In one embodiment as shown in FIG. 2, a concentrator 106 is disposed between the exit aperture 107 of the secondary optical element 104 and the solar cell 102. The concentrator 106 is preferably glass and has an optical inlet 108 and an optical outlet 110. In one embodiment, the concentrator 106 is solid glass. The concentrator 106 amplifies the light exiting the secondary optical element 104 and directs the amplified light toward the solar cell 102. In some implementations, the concentrator 106 has a generally square cross section that tapers from the inlet 108 to the outlet 110. In some implementations, the optical inlet 108 of the concentrator 106 is square-shaped and is about 2 cm×2 cm and the optical outlet 110 is about 0.9 cm×0.9 cm. The dimensions of the concentrator 106 may vary with the design of the solar cell module and the receiver. For example, in some implementations the dimensions of the optical outlet 110 are approximately the same as the dimensions of the solar cell 102. In one embodiment, the concentrator 106 is a 2× concentrator. The bottom surface of the concentrator 106 can be directly attached to the upper surface of the solar cell 102 using an adhesive such as a silicone adhesive. The solar cell 102 converts the incoming sunlight directly into electricity by the photovoltaic effect.

A bypass diode 124 is connected in parallel with the solar cell 102. In some implementations, the diode 124 is a semiconductor device such as a Schottky bypass diode or an epitaxially grown p-n junction. For purposes of illustration, the bypass diode 124 is a Schottky bypass diode. External connection terminals 125 and 127 are provided for connecting the solar cell 102 and the diode 124 to other devices, e.g., adjacent solar cell receivers (not shown).

The functionality of the bypass diode 124 can be appreciated by considering multiple solar cells 102 connected in series. Each solar cell 102 can be envisioned as a battery, with the cathode of each of the diodes 124 being connected to the positive terminal of the associated "battery" and the anode of each of the diodes 124 being connected to the negative terminal of the associated "battery." When one of the serially-connected solar cell receivers 100 becomes damaged or shadowed, its voltage output is reduced or eliminated (e.g., to below a threshold voltage associated with the diode 124). Therefore, the associated diode 124 becomes forward-biased, and a bypass current flows only through that diode 124 (and not the solar cell 102). In this manner, the non-damaged or non-shadowed solar cell receivers 100 continue to generate electricity from the solar energy received by those solar cells. If not for the bypass diode 124, substantially all of the electricity produced by the other solar cell receivers would pass through the shadowed or damaged solar cell receiver, destroying it, and creating an open circuit within, e.g., the panel or array. The solar cell receiver 100 also includes a ceramic substrate 126 such as an alumina substrate for mounting of the solar cell 102 and the heat sink 120 for dissipating heat generated by the solar cell 102 during operation.

FIG. 2 illustrates the solar cell 102 and the ceramic substrate 126 in more detail. The ceramic substrate 126 has metallized upper and lower surfaces 128 and 130. Both surfaces 128 and 130 of the ceramic substrate 126 are metallized to increase the heat transfer capacity of the ceramic substrate 126, enabling the solar cell receiver 100 to more adequately handle rapid temperature changes that occur due to abrupt changes in solar cell operating conditions. For example, the solar cell 102 generates heat energy when converting light to electricity. Having both the upper and lower surfaces 128 and 130 of the ceramic substrate 126 metallized provides for a faster transfer of the heat energy from the solar cell 102 to the heat sink 120 for dissipation. The opposite condition occurs when the solar cell 102 becomes suddenly shaded. That is, the solar cell 102 stops producing electricity and rapidly cools as does the secondary optical element 104. The metallized upper and lower surfaces 128 and 130 of the ceramic substrate 126 prevent the solar cell 102 from cooling too rapidly by transferring heat energy from the heat sink 120 to the solar cell 102, and depending on the thermal conditions, to the secondary optical element 104 as well. The increased heat transfer capacity of the solar cell receiver 100 reduces the amount of stress imparted to the interface between the solar cell 102 and the ceramic substrate 126 during rapid temperature changes, ensuring a reliable solar cell-to-substrate interface.

The metallized upper surface 128 of the ceramic substrate 126 is in contact with the solar cell 102 and has separated conductive regions 132 and 134 for providing isolated electrically conductive paths to the solar cell 102. The first conductive region 132 provides an anode electrical contact point for the solar cell 102 and the second conductive region 134 provides a cathode electrical contact point for the solar cell 102. The solar cell 102 has a conductive lower surface 136 out-of-view in FIG. 2, but visible in the cross-section of FIG. 3 that is positioned on and connected to the first conductive region 132 of the metallized upper surface 128 of the ceramic substrate 126. The opposing upper surface 138 of the solar cell 102 has a conductive contact area 140 connected to the second conductive region 134 of the ceramic substrate 126.

In one embodiment, the conductive lower surface 136 of the solar cell 102 forms an anode terminal of the solar cell 102 and the conductive contact area 140 disposed at the upper surface 138 of the solar cell 102 forms a cathode terminal. According to this embodiment, the conductive lower surface 136 of the solar cell 102 is positioned on the first conductive region 132 of the ceramic substrate 126 and electrically isolated from the second conductive region 134 to ensure proper operation of the solar cell 102. In one embodiment, the first conductive region 132 of the ceramic substrate 126 is at least partly surrounded on three sides by the second conductive region 134 about a periphery region of the ceramic substrate 126.

In one embodiment, the conductive contact area 140 disposed at the upper surface 138 of the solar cell 102 occupies the perimeter of the solar cell 102. In some implementations, the upper conductive contact area 140 can be smaller or larger to accommodate the desired connection type. For example, the upper conductive contact area 140 may touch only one, two or three sides (or portions thereof) of the solar cell 102. In some implementations, the upper conductive contact area 140 is made as small as possible to maximize the area that converts solar energy into electricity, while still allowing electrical connection. While the particular dimensions of the solar cell 102 will vary depending on the application, standard dimensions are about a 1 cm$^2$. For example, a standard set of dimensions can be about 12.58 mm×12.58 mm overall, about 0.160 mm thick, and a total active area of about 108 mm$^2$. For example, in a solar cell 102 that is approximately 12.58 mm×12.58 mm, the upper conductive contact area 140 can be about 0.98 mm wide and the active area can be about 10 mm×10 mm.

The upper conductive contact area 140 of the solar cell 102 may be formed of a variety of conductive materials, e.g., copper, silver, and/or gold-coated silver. In this implementation, it is the n-conductivity cathode (i.e. emitter) side of the solar cell 102 that receives light, and accordingly, the upper conductive contact area 140 is disposed on the cathode side of the solar cell 102. In one embodiment, the upper conductive contact area 140 of the solar cell 102 is wire bonded to the second conductive region 134 of the metallized upper surface 128 of the ceramic substrate 126 via one or more bonding wires 142.

The bypass diode couples the first conductive region 132 of the metallized upper surface 128 of the ceramic substrate 126 to the second conductive region 134. In one embodiment, a cathode terminal of the bypass diode 124 is connected to the anode terminal of the solar cell 102 via the first conductive region 132 of the ceramic substrate 126 and an anode terminal of the bypass diode 124 is electrically connected to the cathode terminal of the solar cell 102 via the second conductive region 134 of the ceramic substrate 126. The anode terminal of the solar cell 102 is formed by the lower conductive surface 136 of the solar cell 102 as described above and is out-of-view in FIG. 2, but visible in the cross-section of FIG. 3. The cathode terminal of the solar cell 102 is formed by the upper conductive contact area 140 of the solar cell 102 also as described above. The external connection terminals 125 and 127 disposed on the metallized upper surface 128 of the ceramic substrate 126 provide for electrical coupling of a device to the solar cell 102 and the bypass diode 124. In some implementations, the connector terminals 125 and 127 correspond to anode and cathode terminals, and are designed to accept receptacle plugs (not shown) for connection to adjacent solar cell receivers.

The upper surface 128 of the ceramic substrate 126 can be metallized by attaching metallization layers 132 and 134 to the substrate. In one embodiment, holes 144 are formed in the metallization layers 132, 134. FIG. 2 shows the ceramic substrate 126 having two metallization layers 132 and 134 attached to the upper substrate surface 128 (the lower metallized surface is out of view in FIG. 2, but visible in the cross-section of FIG. 3). The metallization layers 132 and 134 are attached to the upper surface 128 of the ceramic substrate 126 by high temperature reactive bonding or other type of bonding process. The lower surface 130 of the ceramic substrate 126 can be similarly metallized and attached to the heat sink 120.

Figure 3:
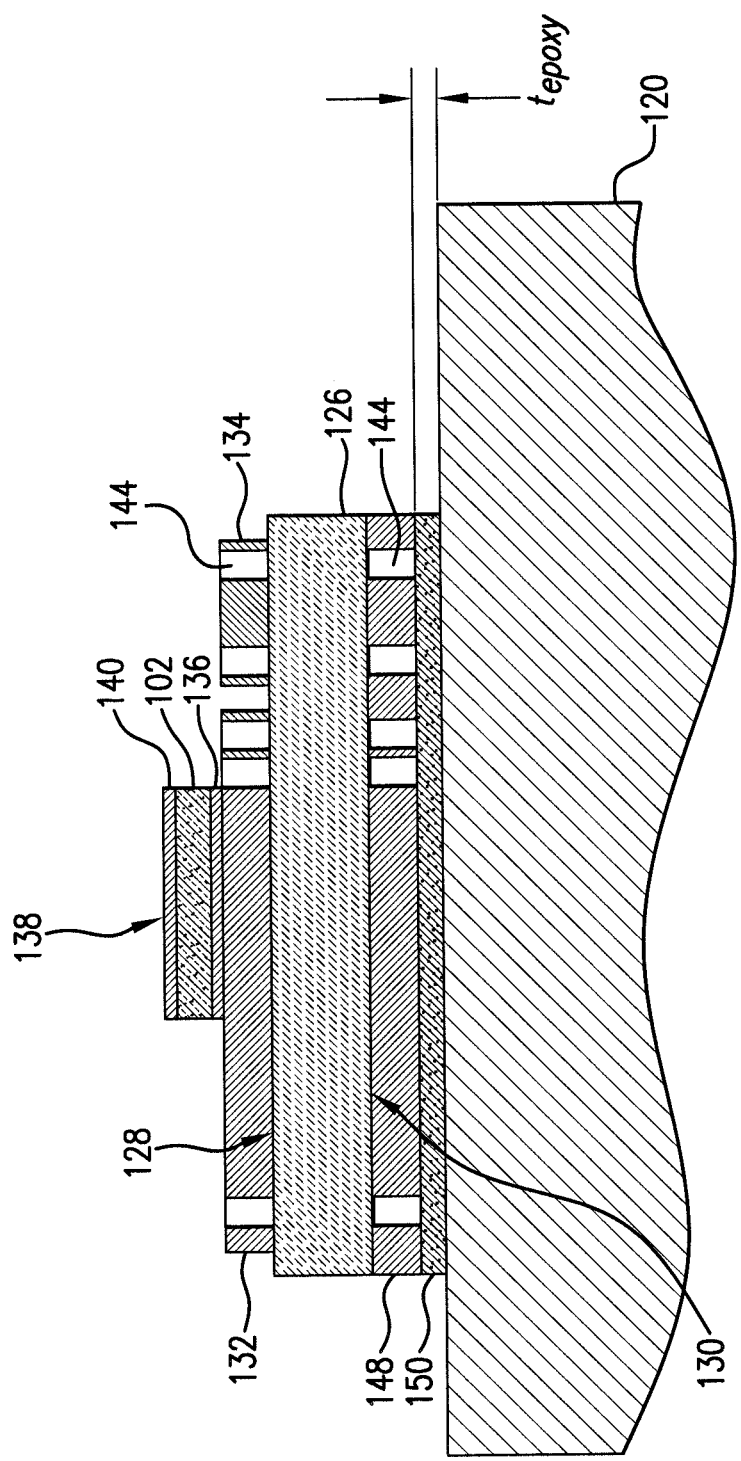
FIG. 3 is a cross-sectional view of the solar cell, the metallized ceramic substrate and the heat sink shown in FIG. 1.

FIG. 3 illustrates a cross-sectional view of the solar cell 102, ceramic substrate 126 and heat sink 120 of the solar cell receiver 100 along the line labeled X-X' in FIG. 1. The secondary optical element 104, light concentrator 106 and terminals 125, 127 are not shown in FIG. 3 for ease of illustration. The upper and lower surfaces 128 and 130 of the ceramic substrate 126 are metallized. The upper metallized surface 128 of the substrate 126 has separated conductive regions 132 and 134 for providing electrically isolated anode and cathode connections to the solar cell 102 as described above.

The solar cell 102 has a conductive lower surface 136 connected to the conductive region 132 of the metallized upper surface 128 of the ceramic substrate 126. In one embodiment, the conductive lower surface 136 of the solar cell 102 forms the anode terminal of the solar cell 102 and the conductive contact area 140 disposed at the upper surface 138 of the solar cell 102 forms the cathode terminal of the solar cell 102. The conductive lower surface 136 of the solar cell 102 is positioned on the first conductive region 132 of the metallized upper surface 128 of the ceramic substrate 126 and electrically isolated from the second conductive region 134 to ensure proper operation of the solar cell 102.

The lower surface 130 of the ceramic substrate 126 also has a metallization layer 148 that is bonded to the heat sink 120 with a highly thermally conductive attach media 150, such as a metal-filled epoxy adhesive or solder. Filling an epoxy adhesive with metal increases the thermal conductivity of the interface between the ceramic substrate 126 and the heat sink 120, further improving the heat transfer characteristics of the solar cell receiver 100. In one embodiment, the highly thermally conductive attach media 150 is a metal-filled epoxy adhesive having a thickness $t_{epoxy}$ of approximately 1 to 3 mils. The metal-filled epoxy adhesive can be applied to the lower metallized surface 130 of the ceramic substrate 126, the heat sink 120 or both and then cured to bond the heat sink 120 to the substrate 126. In one embodiment, the heat sink 120 is a single-piece extruded aluminum heat sink as shown in FIG. 1.

The solar cell receiver 100 can be manufactured by providing the metallized ceramic substrate 126 and connecting the conductive lower surface 136 of the solar cell 102 to the first conductive region 132 of the metallized upper surface 128 of the substrate 126. The conductive contact area 140 disposed at the upper surface 138 of the solar cell 102 is connected to the second conductive region 134 of the metallized upper surface 128 of the ceramic substrate 126, e.g. via one or more bond wires 142. The heat sink 120 is bonded to the lower metallized surface 130 of the ceramic substrate 126 with the metal-filled epoxy adhesive 150.

Figure 4:
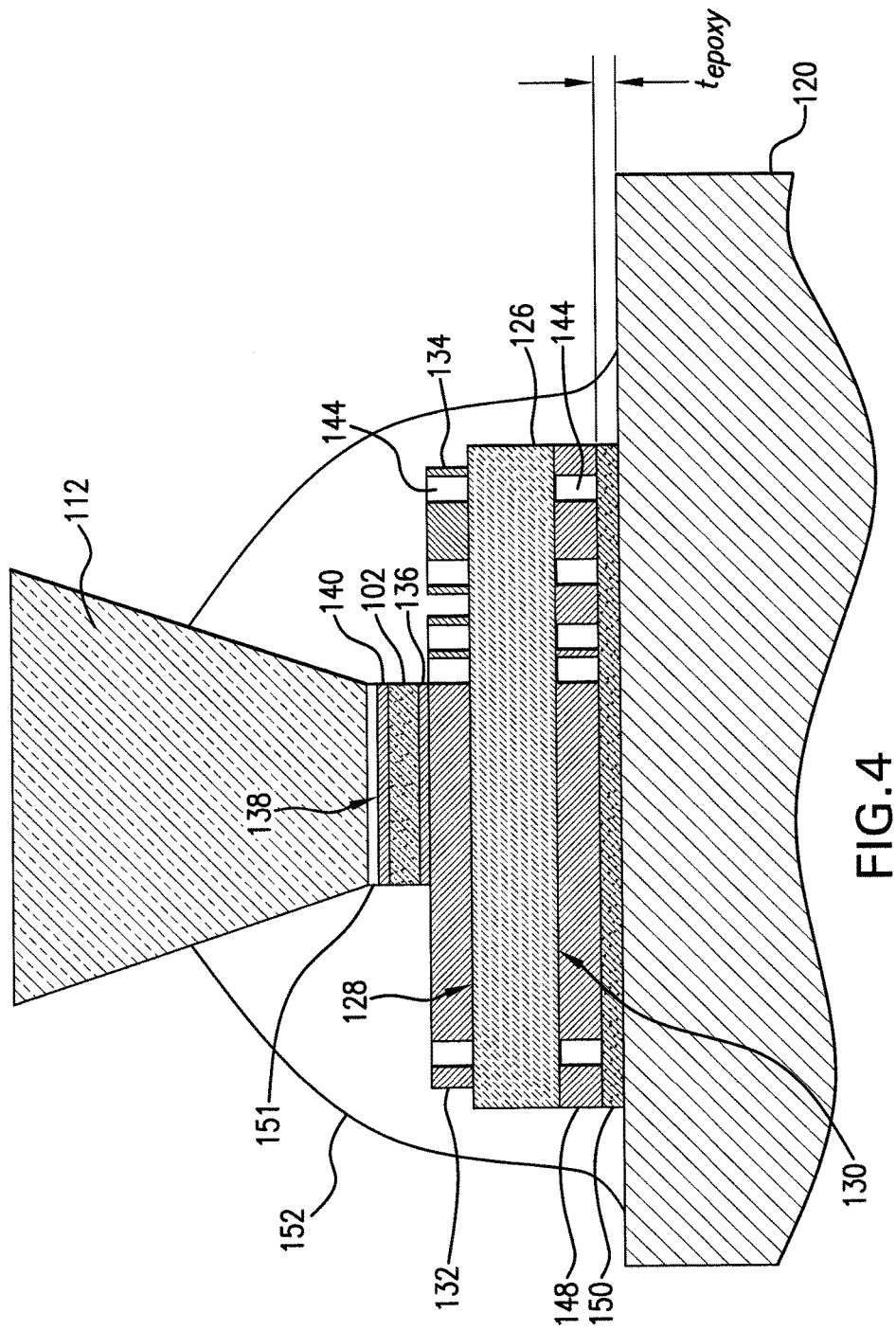
FIG. 4 is a cross-sectional view of the solar cell, the metallized ceramic substrate and the heat sink shown in FIG. 3 after attaching the concentrator optical element and the encapsulant.

FIG. 4 illustrates a cross-sectional view of the solar cell 102, ceramic substrate 126 and heat sink 120 of the solar cell receiver 100 along the line labeled X-X' in FIG. 1 after the bonding of the light concentrator 106 to the upper surface 138 of the solar cell 102 by means of a suitable light transparent adhesive 151. After attachment of the light concentrator 106, the solar cell 102 is surrounded by an encapsulant 152, one embodiment of which may be silicone based. The encapsulant is applied over the entire portion of the ceramic substrate 126 surrounding the solar cell 102, including over the region between the heat sink 120 and the metallized lower surface 130 of the ceramic substrate 126, as well as optionally over the diode 124, and then the encapsulant is subsequently cured by heat or other suitable process.

Spatially relative terms such as "under", "below", "lower", "over", "upper", and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

The present invention may be carried out in other specific ways than those herein set forth without departing from the scope and essential characteristics of the invention. The present embodiments are, therefore, to be considered in all respects as illustrative and not restrictive, and all changes coming within the meaning and equivalency range of the appended claims are intended to be embraced therein.

What is claimed is:

1. A solar cell receiver subassembly for use in a concentrating solar system which concentrates the solar energy onto a solar cell by a factor of 1000 or more for converting solar energy to electricity, comprising:
   a solar cell receiver comprising a support defining an upper surface facing an upper direction and a lower metallized surface facing a lower direction, wherein the lower direction is opposite the upper direction;
   a solar cell defining an upper surface facing the upper direction and a lower surface facing the lower direction, wherein the lower surface of the solar cell is mounted on the upper surface of the support, wherein the solar cell comprises one or more III-V compound semiconductor layers;
   an optical element defining an optical channel from an optical inlet to an optical outlet and configured to direct light toward the solar cell, wherein the optical element defines at least one exterior side surface extending between the optical inlet to the optical outlet, wherein the optical outlet is coupled to the upper surface of the solar cell;
   an encapsulant covering the support, the solar cell, and at least a portion of the at least one exterior side surface of the optical element to surround and encapsulate the solar cell and the support; and
   a heat sink coupled to the lower metalized surface of the support, wherein the encapsulant further covers a region between the lower metalized surface of the support and the heat sink.

2. The solar cell subassembly of claim 1, wherein the encapsulant is a cured silicone based material that is directly applied to each of the support, the solar cell, and the at least a portion of the at least one exterior side surface of the optical element to surround and encapsulate the solar cell and the support.

3. The solar cell subassembly of claim 1, further comprising a diode mounted on the upper surface of the support and having an anode terminal and a cathode terminal, wherein the lower surface of the solar cell is conductive and forms an anode terminal of the solar cell that is electrically coupled to the anode terminal of the diode and the upper surface of the solar cell is conductive and forms a cathode terminal of the solar cell that is electrically coupled to the anode terminal of the diode.

4. The solar cell subassembly of claim 3, wherein the encapsulant further covers the diode.

5. The solar cell subassembly of claim 3, further comprising first and second electrical contacts mounted on the upper surface of the support, wherein the first electrical contact electrically couples the anode terminal of solar cell to the anode terminal of the diode and the second electrical contact electrically couples the cathode terminal of solar cell to the cathode terminal of the diode.

6. The solar cell subassembly of claim 1, wherein the upper surface of the solar cell has dimensions of about 1 cm by about 1 cm.

7. The solar cell subassembly of claim 1, further comprising a transparent adhesive disposed between the optical outlet of the optical element and the upper surface of the solar cell.

8. The solar cell subassembly of claim 1, wherein the optical element is a magnification element.

9. The solar cell subassembly of claim 1, wherein the solar cell is a triple junction solar cell.

10. The solar cell subassembly of claim 1, wherein the support is a ceramic substrate, wherein the upper surface is metallized.

11. A method of manufacturing a solar cell receiver, comprising:
providing a support defining an upper surface facing an upper direction and a lower metallized surface facing a lower direction, wherein the lower direction is opposite the upper direction;
mounting a solar cell on the support comprising one or more III-V compound semiconductor layers, wherein the solar cell defines an upper surface facing the upper direction and a lower surface facing the lower direction, wherein the lower surface of the solar cell is mounted on the upper surface of the support;
mounting an optical element defining an optical channel from an optical inlet to an optical outlet over the solar cell so that the solar cell is in the optical path of the optical channel, wherein the optical element defines at least one exterior side surface extending between the optical inlet to the optical outlet;
encapsulating the support, the solar cell, and at least a portion of the at least one exterior side surface of the optical element in an encapsulant after the optical element has been mounted over the solar cell to surround and encapsulate the solar cell and the support; and
mounting a heat sink to the lower metalized surface of the support, wherein the encapsulant further covers a region between the lower metalized surface of the support and the heat sink.

12. A method as defined in claim 11, further comprising mounting a diode on the upper surface of the support, wherein the diode comprises an anode and a cathode, wherein the lower surface of the solar cell is conductive and forms an anode terminal of the solar cell that is electrically coupled to the anode terminal of the diode and the upper surface of the solar cell is conductive and forms a cathode terminal of the solar cell that is electrically coupled to the anode terminal of the diode.

13. A method as defined in claim 12, wherein encapsulating the support, the solar cell, and at least a portion of the at least one exterior side surface of the optical element in an encapsulant after the optical element has been mounted over the solar cell further comprises encapsulating the diode.

14. A method as defined in claim 11, further comprising mounting first and second electrical contacts on the upper surface of the support, wherein the first electrical contact electrically couples the anode terminal of solar cell to the anode terminal of the diode and the second electrical contact electrically couples the cathode terminal of solar cell to the cathode terminal of the diode.

15. A method as defined in claim 14, wherein each of the first and second electrical contacts further comprises receptacles designed to receive connector plugs.

16. The method of claim 11, wherein the encapsulant is a cured silicon based material that is directly applied to each of the support, the solar cell, and the at least a portion of the at least one exterior side surface of the optical element to surround and encapsulate the solar cell and the support.

* * * * *